US012757381B2

(12) United States Patent
Huang

(10) Patent No.: US 12,757,381 B2
(45) Date of Patent: Oct. 6, 2026

(54) SEMICONDUCTOR STRUCTURE HAVING DIELECTRIC LINER AND METHOD OF MANUFACTURING THE SAME

(71) Applicant: NANYA TECHNOLOGY CORPORATION, New Taipei City (TW)

(72) Inventor: Chih-Wei Huang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 365 days.

(21) Appl. No.: 18/596,967

(22) Filed: Mar. 6, 2024

(65) Prior Publication Data

US 2025/0287562 A1 Sep. 11, 2025

(51) Int. Cl.
*H10B 12/00* (2023.01)

(52) U.S. Cl.
CPC ....... *H10B 12/315* (2023.02); *H10B 12/0335* (2023.02); *H10B 12/482* (2023.02)

(58) Field of Classification Search
CPC . H10B 12/315; H10B 12/482; H10B 12/0335
USPC .......................................................... 257/296
See application file for complete search history.

(56) References Cited

U.S. PATENT DOCUMENTS

2020/0203353 A1* 6/2020 Liu ...................... H10B 12/315
2022/0384449 A1* 12/2022 Kim ................... H10B 12/0335
2024/0021691 A1* 1/2024 Tsai ..................... H10D 62/107

FOREIGN PATENT DOCUMENTS

TW 202145445 A * 12/2021 .......... H10W 20/481
TW 202145455 A 12/2021
TW 202221898 A 6/2022

OTHER PUBLICATIONS

Office Action and and the search report mailed on Feb. 10, 2025 related to Taiwanese Application No. 113114243.
Summary translation of Office Action and and the search report mailed on Feb. 5, 2025 related to Taiwanese Application No. 113114243.
Office Action and and the search report mailed on Jun. 3, 2025 related to Taiwanese Application No. 114101020.
Summary translation of Office Action and and the search report mailed on Jun. 3, 2025 related to Taiwanese Application No. 114101020.

* cited by examiner

*Primary Examiner* — Xia L Cross
(74) *Attorney, Agent, or Firm* — Xuan Zhang

(57) ABSTRACT

The present application discloses a semiconductor structure and a method for fabricating the same. The semiconductor structure includes a substrate; a bit line structure disposed over the substrate; a plurality of capacitor contact structures disposed next to the bit line structure; a plurality of dielectric liners disposed in the capacitor contact structures, wherein each of the dielectric liners surrounds at least a portion of the corresponding capacitor contact structures; and a plurality of landing pad layers each disposed partially covering a top surface and a sidewall of the corresponding capacitor contact structure. The substrate includes an isolation layer, wherein a plurality of active areas are defined by the isolation layer, wherein a plurality of source regions and drain regions are disposed in the active areas.

11 Claims, 33 Drawing Sheets

SEMICONDUCTOR STRUCTURE HAVING DIELECTRIC LINER AND METHOD OF MANUFACTURING THE SAME

TECHNICAL FIELD

The present disclosure relates to a semiconductor structure and a method of manufacturing the semiconductor structure. Particularly, the present disclosure relates to a semiconductor structure having a dielectric liner and a method for forming the semiconductor structure.

DISCUSSION OF THE BACKGROUND

Semiconductor structures are used in a variety of electronic applications, such as personal computers, cellular phones, digital cameras, and other electronic equipment. The semiconductor structures are typically fabricated by sequentially depositing insulating or dielectric layers, conductive layers, and semiconductive layers of material over a semiconductor substrate, and patterning the various material layers using lithography to form circuit components and elements on the substrate. As the semiconductor industry has progressed into advanced technology process nodes in pursuit of greater device density, higher performance, and lower costs, challenges of precise control of lithography across a wafer have arisen, and product performance and production yield are accordingly limited.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate; a bit line structure disposed over the substrate; a plurality of capacitor contact structures disposed next to the bit line structure; a plurality of dielectric liners disposed in the capacitor contact structures, wherein each of the dielectric liners surrounds at least a portion of the corresponding capacitor contact structures; and a plurality of landing pad layers each disposed partially covering a top surface and a sidewall of a corresponding capacitor contact structure. The substrate includes an isolation layer, the isolation layer defines a plurality of active areas, and a plurality of source regions and drain regions are disposed in the active areas.

Another aspect of the present disclosure provides a method for fabricating a semiconductor structure. The method includes providing a substrate; forming a bit line structure on the substrate; forming a capacitor contact structure next to the bit line structure, wherein the capacitor contact structure protrudes from the substrate; recessing a top surface of the bit line structure; forming a landing pad layer partially covering a top surface of the capacitor contact structure and partially covering a sidewall of the capacitor contact structure.

Another aspect of the present disclosure provides a semiconductor structure. The semiconductor structure includes a polysilicon layer having a first surface and a second surface opposite to the first surface; a substrate disposed on the second surface of the polysilicon layer; a plurality of bit line structures disposed on the substrate; and a spacer structure disposed on lateral sidewalls of the bit line structure, wherein in a cross-sectional view perspective, the polysilicon layer includes a pair of dielectric liners disposed in the polysilicon layer and on lateral sidewalls of the spacer structure, and wherein the dielectric liners are separated from each other and pairs of the dielectric liners face toward each other.

Another aspect of the present disclosure provides a method for fabricating a semiconductor structure. The method includes receiving a substrate; forming a bit line structure on a top surface of the substrate; forming a spacer structure on the bit line structure, wherein the spacer structure includes a sacrificial layer sandwiched by a first dielectric layer and a second dielectric layer; forming a polysilicon layer over the top surface of the substrate and forming a pair of dielectric liners in the polysilicon layer, wherein the polysilicon layer has a first surface and a second surface opposite to the first surface; removing the sacrificial layer to form a gap between the first dielectric layer and the second dielectric layer; reducing a width of the gap; and forming a seal layer to seal the gap.

In conclusion, the application discloses a manufacturing method of a semiconductor structure and a semiconductor structure thereof. The presence of a dielectric liner of the semiconductor structure prevents a storage leakage from a bit line structure to a polysilicon layer, and correctness of data stored in the bit line structure can be protected.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled with the figures' reference numbers, which refer to similar elements throughout the description.

DETAILED DESCRIPTION

Figure 1:
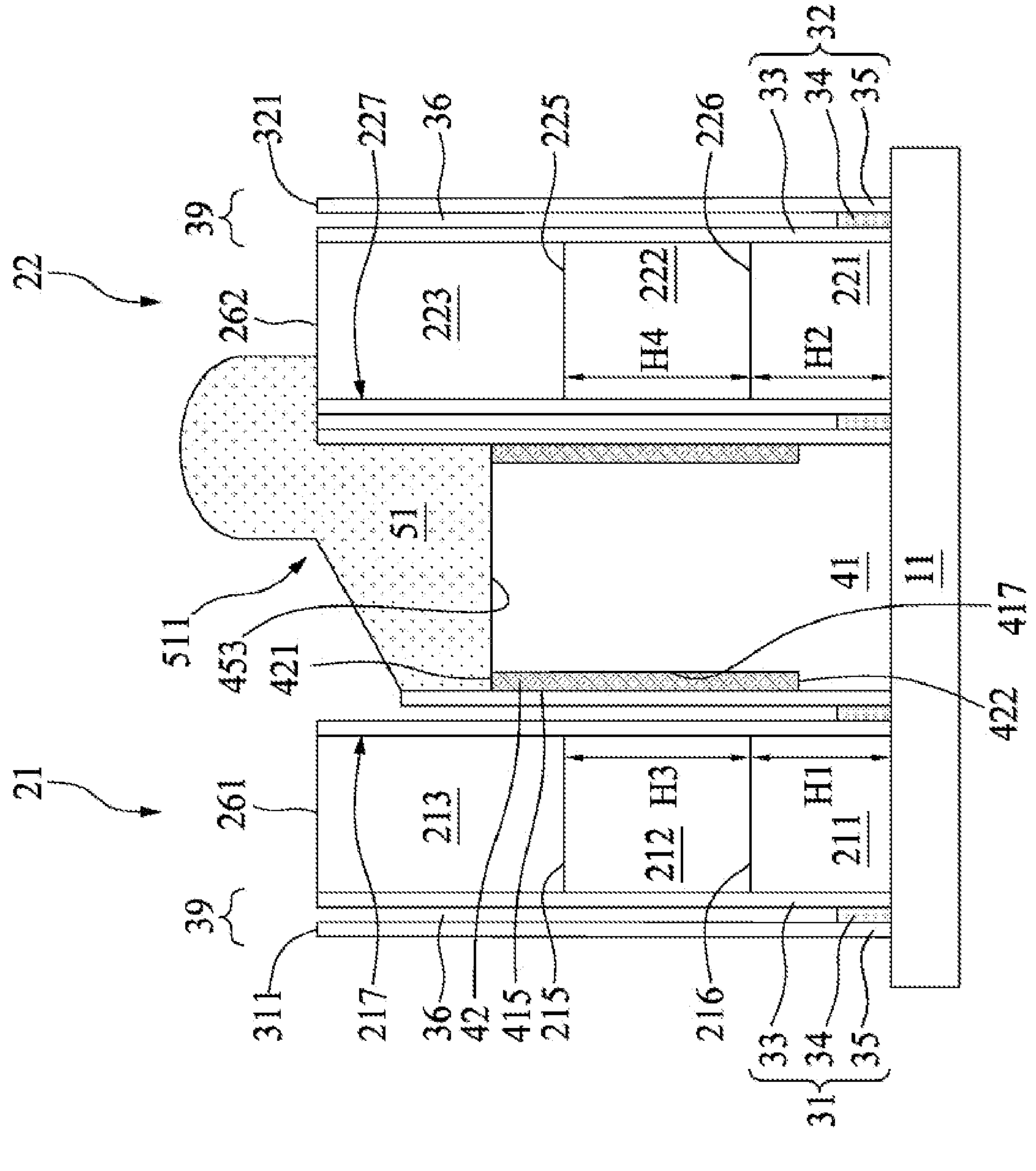
FIG. 1 is a schematic cross-sectional diagram of a semiconductor structure in accordance with some embodiments of the present disclosure.

Embodiments, or examples, of the disclosure illustrated in the drawings are now described using a specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is to describe particular example embodiments only and is not intended to be limiting to the present inventive concept. As used herein, the singular forms "a," "an" and "the" are intended to include the plural forms as well, unless the context indicates otherwise. It should be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has reached an advanced precision of photolithography. In order to further reduce device sizes, dimensions of elements and distances between different elements have to be proportionally reduced. However, with the reductions in the dimensions of the elements and the distances between different elements, challenges of precise control of the dimensions and the distances have arisen. For instance, a landing pad can be disconnected by a sharp corner of a bit line structure after an etching operation.

FIG. 1 is a schematic cross-sectional diagram of a semiconductor structure in accordance with some embodiments of the present disclosure. The semiconductor structure may include a substrate 11, a first bit line structure 21 disposed over the substrate 11, a second bit line structure 22 disposed over the substrate 11, a polysilicon layer 41 disposed over the substrate 11 and surrounded by the first bit line structure 21 and the second bit line structure 22, a dielectric liner 42 surrounding at least a portion 417 of the polysilicon layer 41, and a landing pad 51 disposed over the polysilicon layer 41, the dielectric liner 42 and the second bit line structure 22.

In some embodiments, the substrate 11 may have a multilayer structure, or the substrate 11 may include a multilayer compound semiconductor structure. In some embodiments, the substrate 11 includes semiconductor structures, electrical components, electrical elements, or a combination thereof. In some embodiments, the substrate 11 includes transistors or functional units of transistors. In some embodiments, the substrate 11 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., a system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient SiGe feature in which Si and Ge compositions change from one ratio at one location to another ratio at another location of the gradient SiGe feature. In some embodiments, the SiGe alloy is formed over a silicon substrate. In some embodiments, a SiGe alloy can be mechanically strained by another material in contact with the SiGe alloy.

The first bit line structure 21 includes a first conductive layer 211, a second conductive layer 212 disposed over the first conductive layer 211, and a first dielectric layer 213 disposed over the second conductive layer 212. In some embodiments, a height of the first dielectric layer 213 is greater than a height H3 of the second conductive layer 212. In some embodiments, the height of the second conductive layer 212 is greater than a height H1 of the first conductive layer 211. In some embodiments, the first conductive layer 211 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. In some embodiments, the first conductive layer 211 includes tungsten (W). In some embodiments, the second conductive layer 212 includes a material different from a material of the first conductive layer 211. In some embodiments, the first dielectric layer 213 includes silicon nitride, metallic nitride, or a combination thereof.

The second bit line structure 22 includes a second dielectric layer 221, a third conductive layer 222 disposed over the second dielectric layer 221, and a third dielectric layer 223 disposed over the third conductive layer 222. In some embodiments, a height of the third dielectric layer 223 is greater than a height H4 of the third conductive layer 222. In some embodiments, the height H4 of the third conductive layer 222 is greater than a height H2 of the second dielectric layer 221. In some embodiments, the second dielectric layer 221 includes silicon nitride, metallic nitride, or a combination thereof. In some embodiments, the third dielectric layer 223 includes a nitride material same as a nitride material of the second dielectric layer 221. In some embodiments, the third conductive layer 222 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. In some embodiments, the third conductive layer 222 includes tungsten (W).

In some embodiments, the first dielectric layer 213, the second dielectric layer 221 and the third dielectric layer 223 include a same material. In some embodiments, the second conductive layer 212 and the third conductive layer 222 include a same material.

In some embodiments, the height H1 of the first conductive layer 211 of the first bit line structure 21 is substantially equal to the height H2 of the second dielectric layer 221 of the second bit line structure 22. In some embodiments, the height H3 of the second conductive layer 212 of the first bit line structure 21 is substantially equal to the height H4 of the third conductive layer 222 of the second bit line structure 22.

The semiconductor structure may further include a first spacer 31 surrounding the first bit line structure 21, and a second spacer 32 surrounding the second bit line structure 22. In some embodiments, detailed structures and configurations of the first spacer 31 and the second spacer 32 are substantially identical. For brevity, only the first spacer 31 is described in the following description, and a detailed description of the second spacer 32 is omitted herein. However, such omission is not intended to limit the present disclosure.

In some embodiments, the first spacer 31 may be a multi-layer 39 structure. In some embodiments, the first spacer 31 includes a first nitride layer 33, an oxide layer 34 and a second nitride layer 35. In some embodiments, the oxide layer 34 is sandwiched between the first nitride layer 33 and the second nitride layer 35. In some embodiments, a thickness of the first nitride layer 33 is substantially equal to a thickness of the second nitride layer 35. In some embodiments, a thickness of the oxide layer 34 is less than that of the first nitride layer 33 or the second nitride layer 35. In some embodiments, the first nitride layer 33 and the second nitride layer 35 include a same nitride material. In some embodiments, the oxide layer 34 includes silicon oxide. In some embodiments, the first nitride layer 33 or the second nitride layer 35 includes silicon nitride.

In some embodiments, the first spacer 31 is disposed along a sidewall 217 of the first bit line structure 21. In some embodiments, the second spacer 32 is disposed along a sidewall 227 of the second bit line structure 22. In some embodiments, the first spacer 31 and the second spacer 32 surround the polysilicon layer 41 and the dielectric liner 42.

The polysilicon layer 41 is disposed over the substrate 11 and surrounded by the first bit line structure 21 and the second bit line structure 22. In some embodiments, the polysilicon layer 41 is disposed between the first bit line structure 21 and the second bit line structure 22 adjacent to the first bit line structure 21. In some embodiments, a top surface 453 of the polysilicon layer 41 is higher than the second conductive layer 212 and higher than the third conductive layer 222. In some embodiments, the top surface 453 of the polysilicon layer 41 is lower than a top surface 261 of the first bit line structure 21 and lower than a top surface 262 of the second bit line structure 22. The polysilicon layer 41 can function as a contact for forming electrical connections to other electrical components, devices or elements in the substrate 11. In some embodiments, the polysilicon layer 41 may include multiple portions (i.e., the polysilicon layer 41 between the first bit line structure 21 and the second bit line structure 22 can be one of the multiple portions) electrically isolated from one another, and different portions of the polysilicon layer 41 may electrically connect to different electrical components, devices or elements in the substrate 11.

In some embodiments, the first spacer 31 and the second spacer 32 protrude from the top surface 453 of the polysilicon layer 41. In some embodiments, a top surface 311 of the first spacer 31 and a top surface 321 of the second spacer 32 are higher than the top surface 453 of the polysilicon layer 41.

As mentioned above, the dielectric liner 42 surrounds the portion 417 of the polysilicon layer 41. In some embodiments, the dielectric liner 42 is disposed along a sidewall 415 of the polysilicon layer 41. In some embodiments, a thickness of the dielectric liner 42 is substantially less than half of a width of the polysilicon layer 41.

In some embodiments, a top surface 421 of the dielectric liner 42 is higher than a top surface 215 of the second conductive layer 212, and a bottom surface 422 of the dielectric liner 42 is lower than a bottom surface 216 of the second conductive layer 212. In other words, a height of the dielectric liner 42 is substantially greater than the height H3 of the second conductive layer 212 of the first bit line structure 21.

In some embodiments, the top surface 421 of the dielectric liner 42 is higher than a top surface 225 of the third conductive layer 222, and the bottom surface 422 of the dielectric liner 42 is lower than a bottom surface 226 of the third conductive layer 222. In other words, the height of the dielectric liner 42 is substantially greater than the height H4 of the third conductive layer 222 of the second bit line structure 22.

One or more of the landing pads 51 may be disposed over the polysilicon layer 41, the dielectric liner 42 and the second bit line structure 22. In some embodiments, the landing pad 51 includes one or more metallic materials, such as aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, each of the landing pads 51 is disposed over a corresponding portion of the polysilicon layer 41. In some embodiments, the landing pads 51 are electrically isolated from one another.

In some embodiments, the landing pad 51 includes a neck portion 511 aligned with the top surface 262 of the second bit line structure 22. In some embodiments, the neck portion 511 is a portion of the landing pad 51 with a smallest width. In some embodiments, the top surface 421 of the dielectric liner 42 is lower than the neck portion 511 of the landing pad 51.

Figure 2:
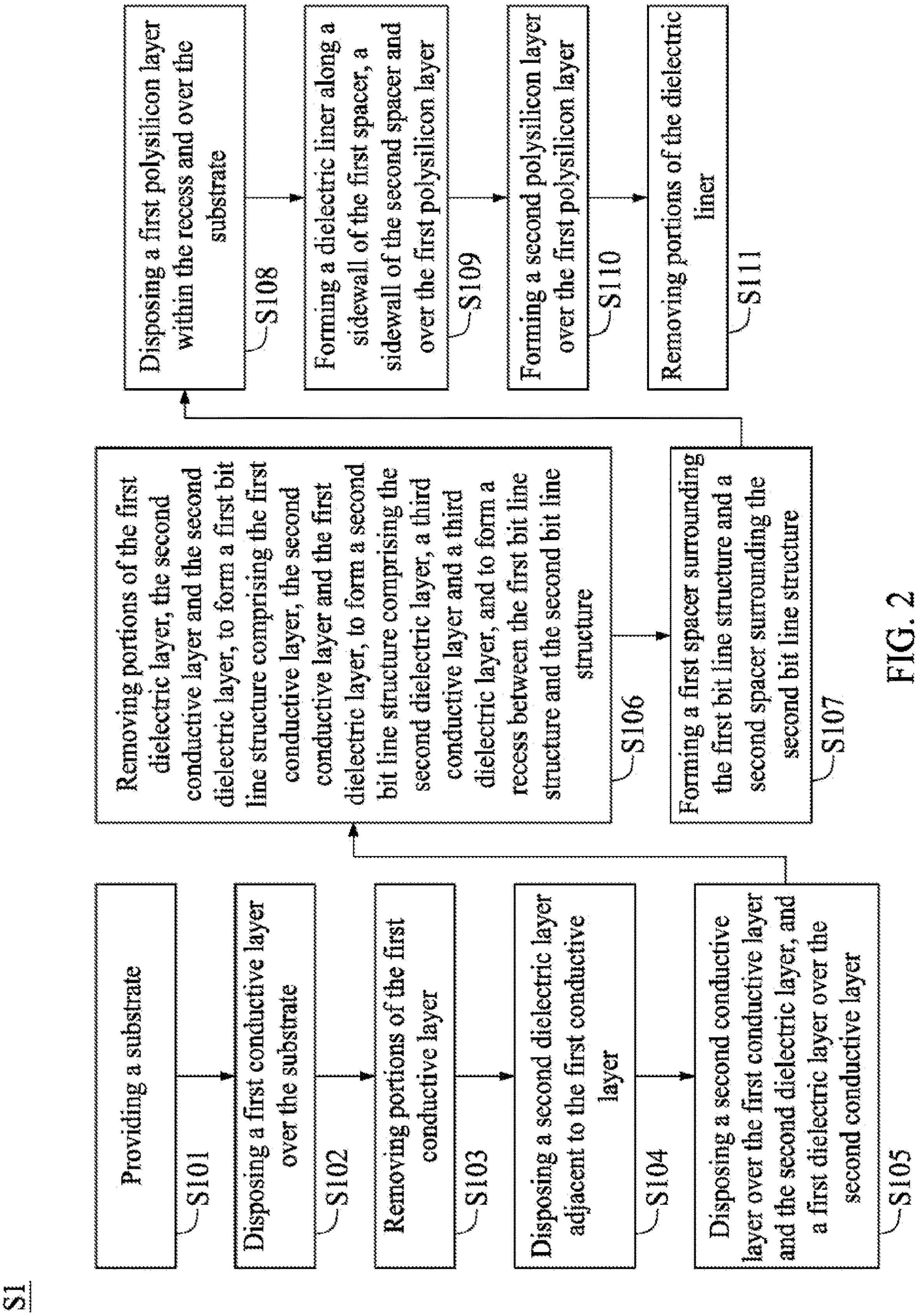
FIG. 2 is a flow diagram illustrating a method for manufacturing a semiconductor structure in accordance with some embodiments of the present disclosure.

FIG. 2 is a flow diagram illustrating a method S1 for manufacturing a semiconductor structure in accordance with some embodiments of the present disclosure. The method S1 includes a number of operations (S101, S102, S103, S104, S105, S106, S107, S108, S109, S110 and S111) and the description and illustration are not deemed as a limitation to the sequence of the operations. In operation S101, a substrate is provided. In operation S102, a first conductive layer is disposed over the substrate. In operation S103, portions of the first conductive layer are removed. In operation S104, a second dielectric layer is disposed adjacent to the first conductive layer. In operation S105, a second conductive layer is disposed over the first conductive layer and the second dielectric layer, and a first dielectric layer is disposed over the second conductive layer. In operation S106, portions of the first dielectric layer, the second conductive layer and the second dielectric layer are removed, to form a first bit line structure comprising the first conductive layer, the second conductive layer and the first dielectric layer, to form a second bit line structure comprising the second dielectric layer, a third conductive layer and a third dielectric layer, and to form a recess between the first bit line structure and the second bit line structure. In operation S107, a first spacer surrounding the first bit line structure and a second spacer surrounding the second bit line structure are formed. In operation S108, a first polysilicon layer is formed within the recess and over the substrate. In operation S109, a dielectric liner is formed along a sidewall of the first spacer, a sidewall of the second spacer and over the first polysilicon layer. In operation S110, a second polysilicon layer is formed over the first polysilicon layer. In operation S111, portions of the dielectric liner are removed. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

FIGS. 3 to 29 are schematic cross-sectional diagrams illustrating various fabrication stages constructed according to the method S1 for manufacturing a semiconductor structure similar to that shown in FIG. 1 in accordance with some embodiments of the present disclosure. The stages shown in FIGS. 3 to 29 are also illustrated schematically in the process flow in FIG. 2. In the subsequent discussion, the fabrication stages shown in FIGS. 3 to 29 are discussed with reference to the process steps in FIG. 2.

Figure 3:
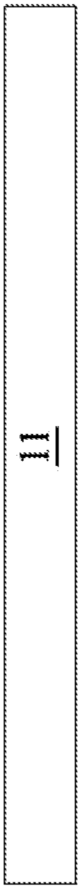
FIGS. 3 to 29 are schematic cross-sectional diagrams of intermediate stages in the formation of a semiconductor structure in accordance with some embodiments of the present disclosure.

Referring to FIG. 3, FIG. 3 is a schematic cross-sectional diagram at a stage of the method S1 in accordance with some embodiments of the present disclosure. In operation S101, a substrate 11 is provided, received, or formed. In some embodiments, the substrate 11 may have a multilayer structure, or the substrate 11 may include a multilayer compound semiconductor structure. In some embodiments, the substrate 11 includes semiconductor structures, electrical components, electrical elements or a combination thereof. In some embodiments, the substrate 11 includes transistors or functional units of transistors. In some embodiments, the substrate 11 includes active components, passive components, and/or conductive elements. In some embodiments, the substrate 11 is similar to that shown in FIG. 1. The substrate 11 can be formed following a conventional method for forming a semiconductor substrate.

Figure 4:
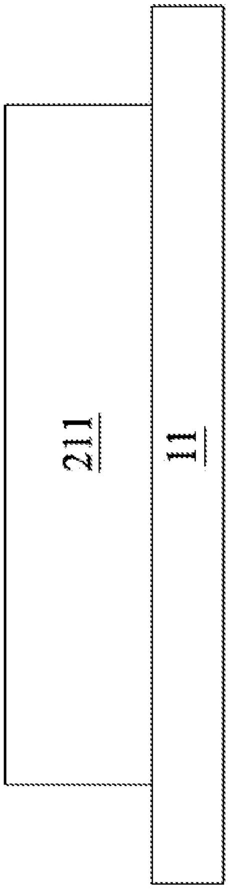

Referring to FIG. 4, FIG. 4 is a schematic cross-sectional diagram at a stage of the method S1 in accordance with some embodiments of the present disclosure. In some embodiments, the operation S102 is performed after the operation S101. In operation S102, a first conductive layer 211 is disposed or formed over the substrate 11.

Referring to FIGS. 5 to 8, FIGS. 5 to 8 are schematic cross-sectional diagrams at a stage of the method S1 in accordance with some embodiments of the present disclosure. In some embodiments, the operation S103 is performed after the operation S102 and includes multiple steps.

Figure 5:
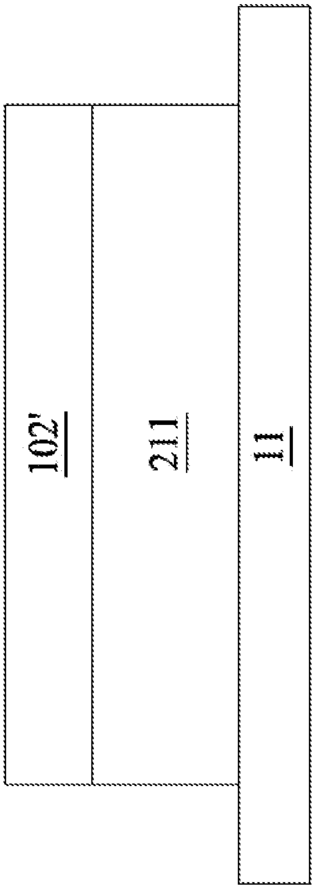
Figure 6:
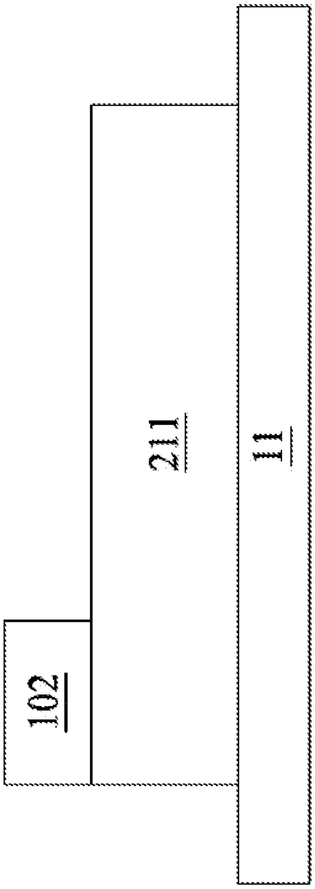

Referring to FIGS. 5 to 6, FIGS. 5 to 6 are schematic cross-sectional diagrams at a stage of the method S1 in accordance with some embodiments of the present disclosure. A patterned mask 102 is disposed over the first conductive layer 211 according to step S103 in FIG. 2. In some embodiments, the disposing of the patterned mask 102 includes disposing a photoresist 102' over the first conductive layer 211 as shown in FIG. 5, and then removing some portions of the photoresist 102' to form the patterned mask 102 as shown in FIG. 6.

In some embodiments, the photoresist 102' is disposed by spin coating or any other suitable process. In some embodiments, some portions of the photoresist 102' are removed by etching or any other suitable process. In some embodiments, at least a portion of the first conductive layer 211 is exposed through the patterned mask 102 after the formation of the patterned mask 102 as shown in FIG. 6.

Figure 7:
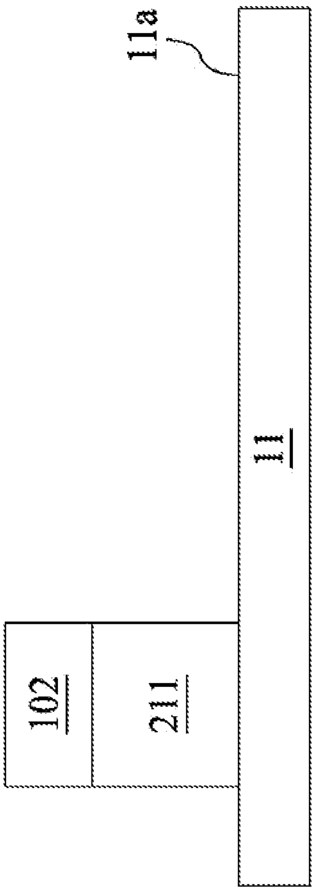
Figure 8:
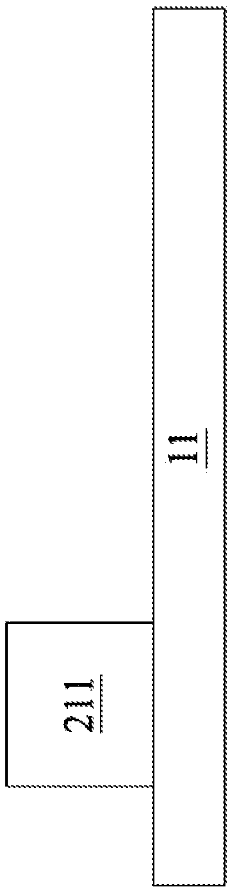

Referring to FIGS. 7 to 8, FIGS. 7 to 8 are schematic cross-sectional diagrams at a stage of the method S1 in accordance with some embodiments of the present disclosure. Portions of the first conductive layer 211 are removed. In some embodiments, the removal of the portions of the first conductive layer 211 includes etching or any other suitable process. In some embodiments, at least a portion of a surface 11*a* of the substrate 11 is exposed after the removal of the portions of the first conductive layer 211 as shown in FIG. 7. In some embodiments as shown in FIG. 8, after the removal of the portions of the first conductive layer 211, the patterned mask 102 is removed by etching, stripping or any other suitable process.

Figure 9:
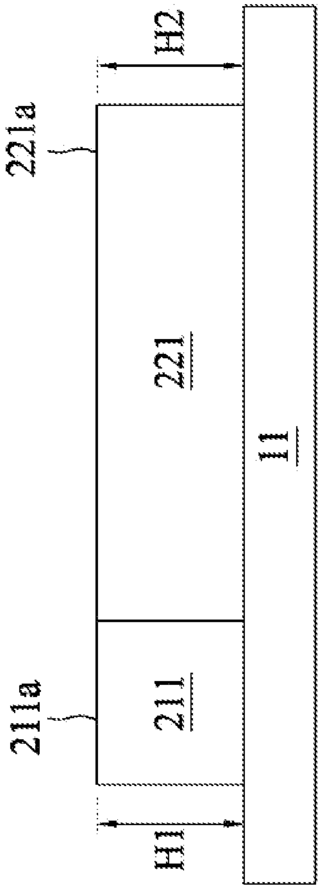

Referring to FIG. 9, FIG. 9 is a schematic cross-sectional diagram at a stage of the method S1 in accordance with some embodiments of the present disclosure. In operation S104, a second dielectric layer 221 is disposed or formed over the substrate 11 and adjacent to the first conductive layer 211. In some embodiments, a top surface 211*a* of the first conductive layer 211 is substantially coplanar with a top surface 221*a* of the second dielectric layer 221. In some embodiments, a height H1 of the first conductive layer 211 is substantially equal to a height H2 of the second dielectric layer 221.

Figure 10:
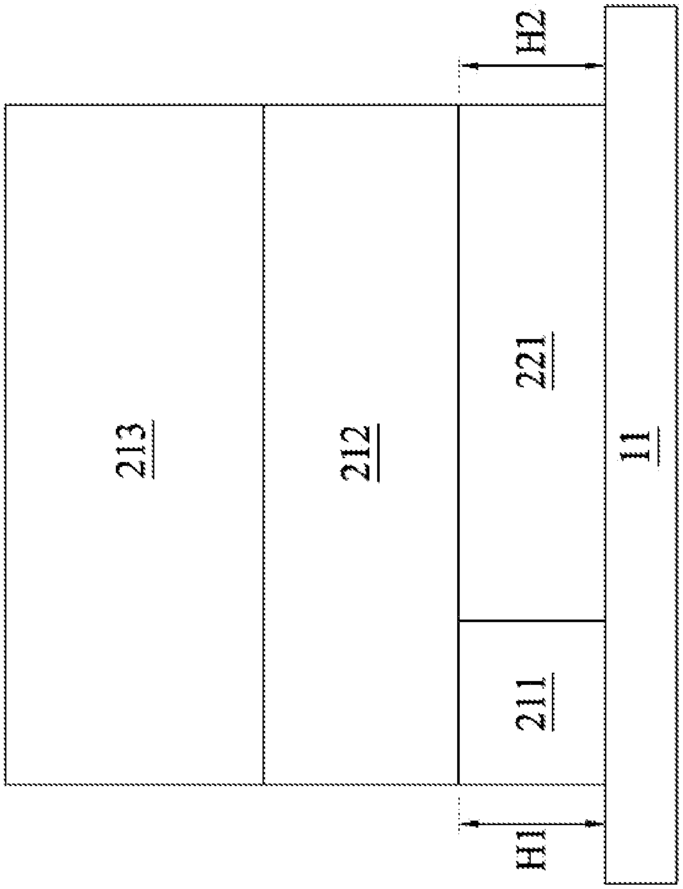

Referring to FIG. 10, FIG. 10 is a schematic cross-sectional diagram at a stage of the method S1 in accordance with some embodiments of the present disclosure. In operation S105, a second conductive layer 212 is disposed over the first conductive layer 211 and the second dielectric layer 221, and a first dielectric layer 213 is disposed over the second conductive layer 212. In some embodiments, a thickness of the first dielectric layer 213 is greater than a thickness of the second conductive layer 212. In some embodiments, the thickness of the second conductive layer 212 is greater than the height H1 of the first conductive layer 211 and greater than the height H2 of the second dielectric layer 221.

In some embodiments, each of the second dielectric layer 221 and the first dielectric layer 213 includes one or more dielectric materials. In some embodiments, the dielectric material includes a polymeric material, an organic material, an inorganic material, a photoresist material, or a combination thereof. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon-based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure. In some embodiments, the dielectric material includes silicon oxide ($SiO_x$), silicon nitride ($Si_xN_y$), silicon oxynitride (SiON), metallic nitride, or a combination thereof.

In some embodiments, the second dielectric layer 221 or the first dielectric layer 213 includes silicon nitride, metallic nitride, or a combination thereof. In some embodiments, the second dielectric layer 221 or the first dielectric layer 213 is formed by a blanket deposition. In some embodiments, the second dielectric layer 221 or the first dielectric layer 213 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

In some embodiments, the first conductive layer 211 or the second conductive layer 212 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable conductive materials, oxides of the above-mentioned metals, or a combination thereof. In some embodiments, the first conductive layer 211 or the second conductive layer 212 includes tungsten (W). In some embodiments, the second conductive layer 212 includes a material different from a material of the first conductive layer 211. In some embodiments, the first conductive layer 211 or the second conductive layer 212 is formed by CVD, PVD, a sputtering operation, an electroplating operation, an electroless-plating operation, or a combination thereof.

Referring to FIGS. 11 to 14, FIGS. 11 to 14 are schematic cross-sectional diagrams at a stage of the method S1 in accordance with some embodiments of the present disclosure. In some embodiments, the operation S106 is performed after the operation S105 and includes multiple steps.

Figure 11:
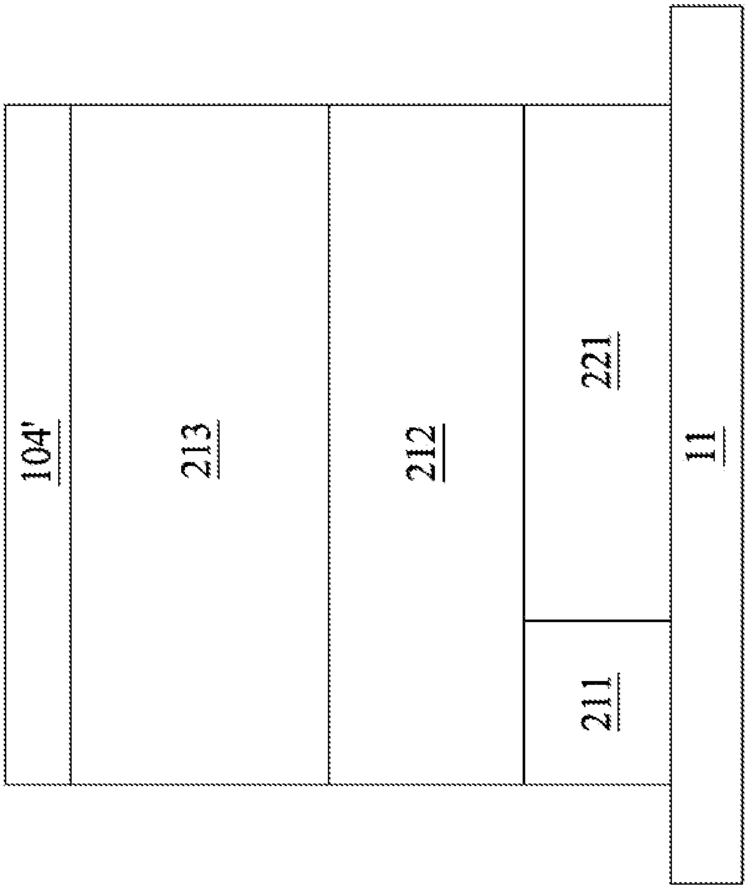
Figure 12:
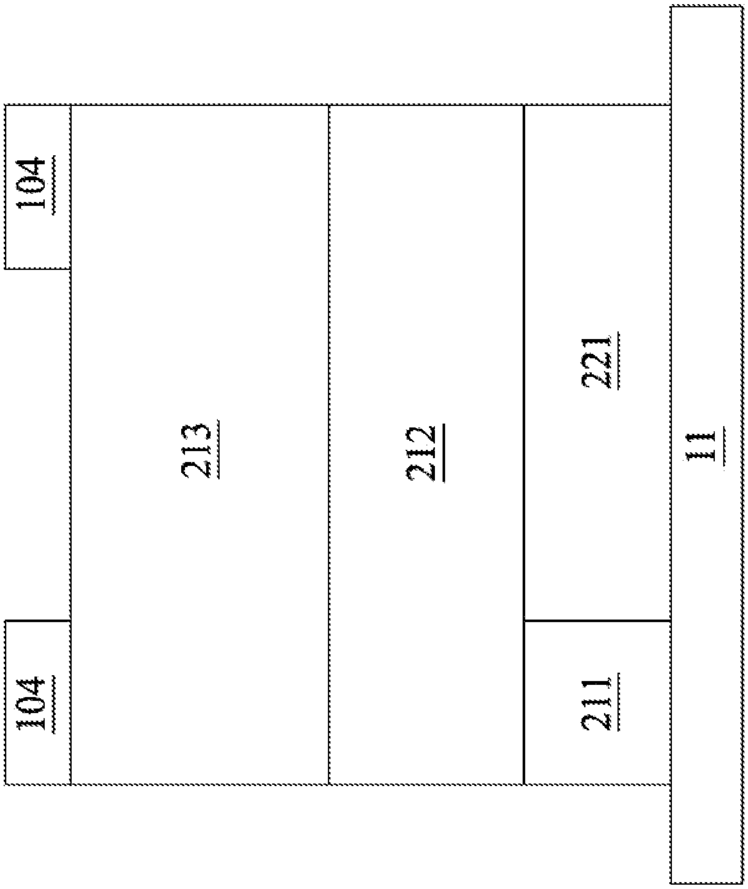

Referring to FIGS. 11 to 12, FIGS. 11 to 12 are schematic cross-sectional diagrams at a stage of the method S1 in accordance with some embodiments of the present disclosure. A patterned mask 104 is disposed over the first dielectric layer 213 according to step S106 as shown in FIG. 12. In some embodiments, the disposing of the patterned mask 104 includes disposing a photoresist 104' over the first dielectric layer 213 as shown in FIG. 11, and then removing some portions of the photoresist 104' to form the patterned mask 104 as shown in FIG. 12.

In some embodiments, the photoresist 104' is disposed by spin coating or any other suitable process. In some embodiments, some portions of the photoresist 104' are removed by etching or any other suitable process. In some embodiments, at least a portion of the first dielectric layer 213 is exposed through the patterned mask 104 after the formation of the patterned mask 104 as shown in FIG. 12.

Figure 13:
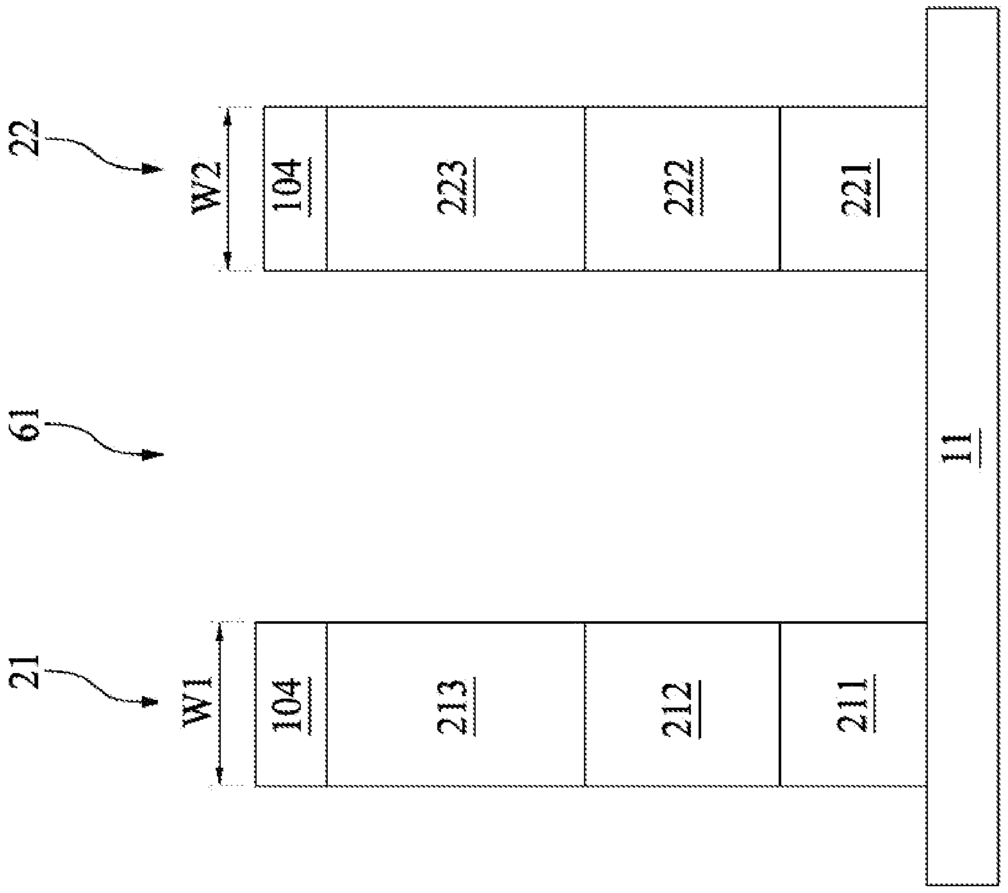
Figure 14:
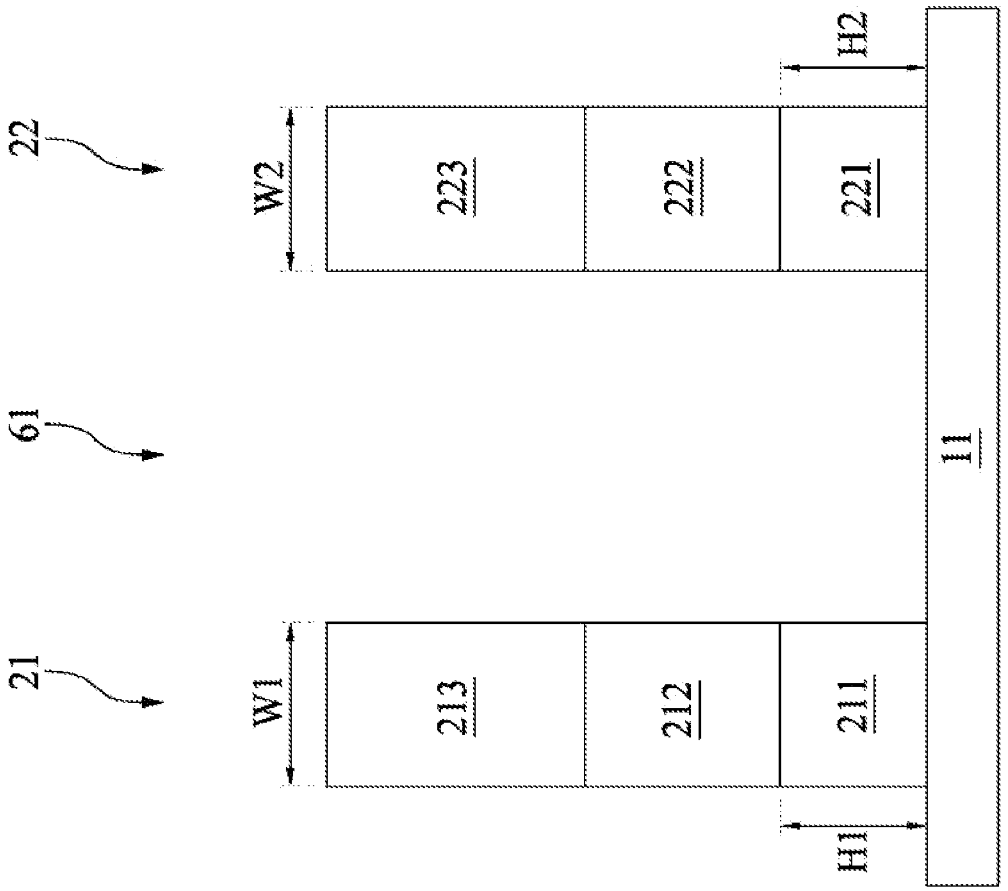

Referring to FIGS. 13 to 14, FIGS. 13 to 14 are schematic cross-sectional diagrams at a stage of the method S1 in accordance with some embodiments of the present disclosure. Portions of the first dielectric layer 213, the second conductive layer 212 and the second dielectric layer 221 are removed.

In some embodiments, the removal of the portions of the first dielectric layer 213, the second conductive layer 212 and the second dielectric layer 221 includes etching or any other suitable process.

In some embodiments, after the removal of the portions of the first dielectric layer 213, the second conductive layer 212 and the second dielectric layer 221 as shown in FIG. 13, a first bit line structure 21, a second bit line structure 22 and a recess 61 between the first bit line structure 21 and the second bit line structure 22 are formed. The first bit line structure 21 includes the first conductive layer 211, the second conductive layer 212 and the first dielectric layer 213. The second bit line structure 22 includes the second dielectric layer 221, the third conductive layer 222 and the third dielectric layer 223. In some embodiments, a width W1 of the first bit line structure 21 is substantially equal to a width W2 of the second bit line structure 22.

In some embodiments, as shown in FIG. 14, after the removal of the portions of the first dielectric layer 213, the second conductive layer 212 and the second dielectric layer 221, the patterned masks 104 are removed by etching, stripping, or any other suitable process.

Figure 15:
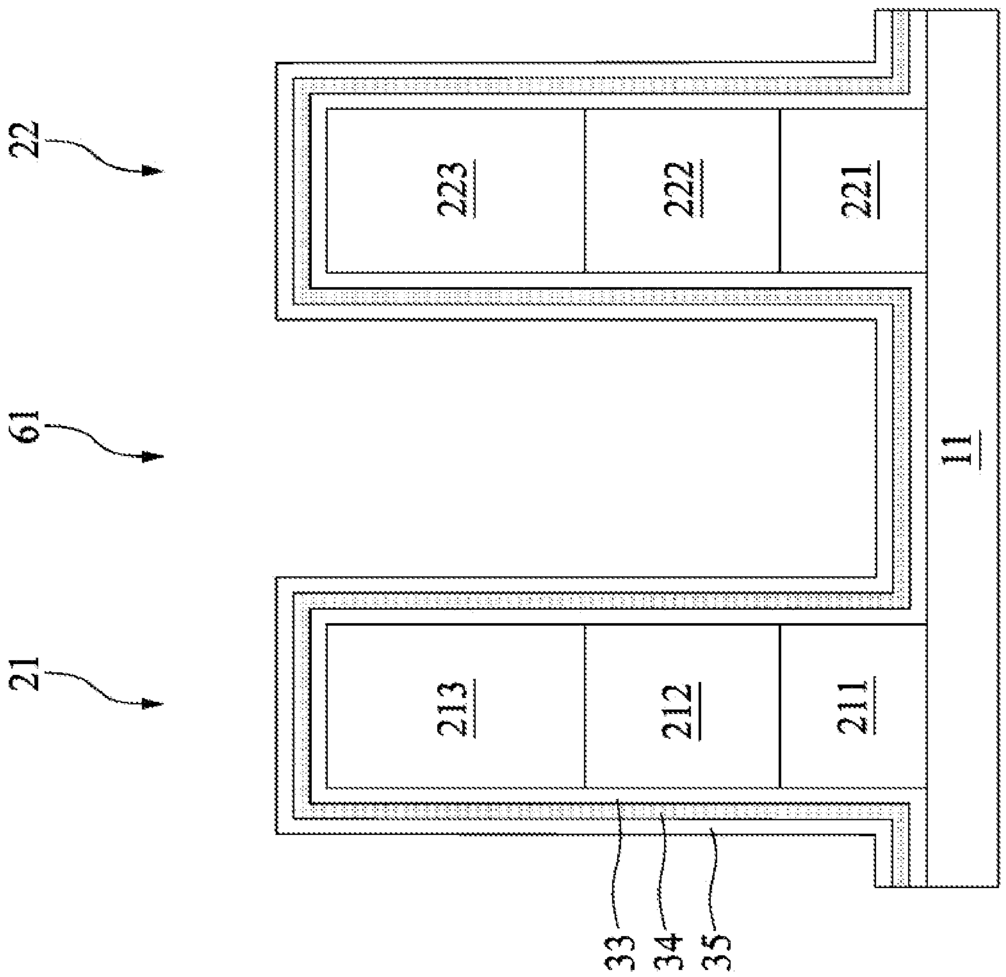
Figure 16:
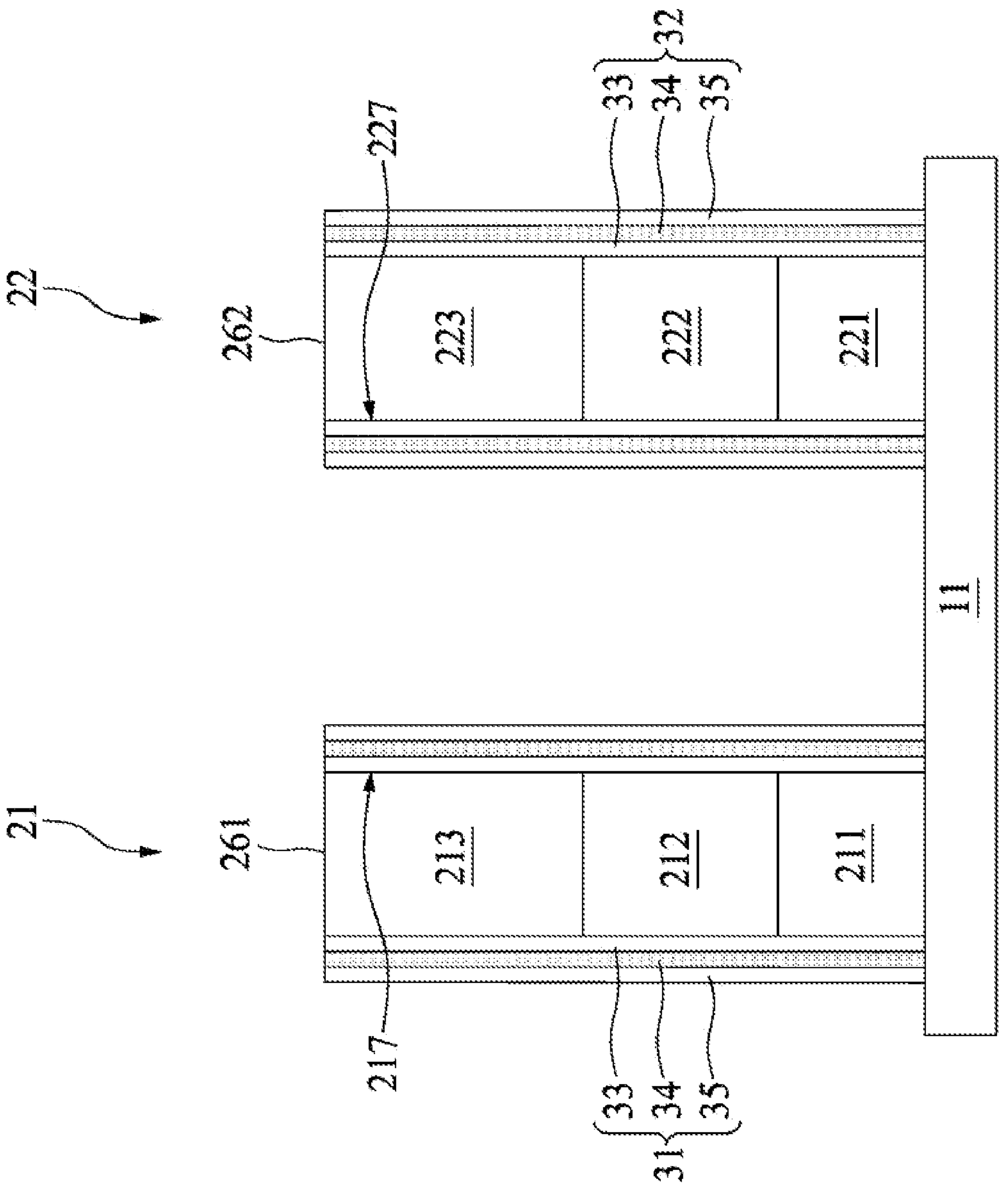

Referring to FIGS. 15 to 16, FIGS. 15 to 16 are schematic cross-sectional diagrams at a stage of the method S1 in accordance with some embodiments of the present disclosure. In some embodiments, operation S107 is performed after the operation S106 and includes multiple steps.

Referring to FIG. 15, FIG. 15 is a schematic cross-sectional diagram at a stage of the method S1 in accordance with some embodiments of the present disclosure. After the formation of the first bit line structure 21 and the second bit line structure 22, one or more conformal layers are formed over the first bit line structure 21, the second bit line structure 22 and the substrate 11. In some embodiments, each of the conformal layers includes a dielectric material, and two adjacent conformal layers may include different dielectric materials. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon-based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

As shown in FIG. 15, in some embodiments, the multiple conformal layers include a first nitride layer 33, a second nitride layer 35, and an oxide layer 34 between the first nitride layer 33 and the second nitride layer 35. In some embodiments, a profile of each of the first nitride layer 33, the oxide layer 34 and the second nitride layer 35 is conformal to a profile of the first bit line structure 21, the second bit line structure 22 and the substrate 11. In some embodiments, the first nitride layer 33, the oxide layer 34 and the second nitride layer 35 are individually formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, each of the first nitride layer 33, the oxide layer 34 and the second nitride layer 35 is formed by a conformal deposition. In some embodiments, a thickness of the first nitride layer 33 is substantially equal to a thickness of the second nitride layer 35. In some embodiments, a thickness of the oxide layer 34 is less than that of the first nitride layer 33 or the second nitride layer 35. In some embodiments, the first nitride layer 33 and the second nitride layer 35 include a same nitride material. In some embodiments, the oxide layer 34 includes silicon oxide. In some embodiments, the first nitride layer 33 or the second nitride layer 35 includes silicon nitride.

Referring to FIG. 16, FIG. 16 is a schematic cross-sectional diagram at a stage of the method S1 in accordance with some embodiments of the present disclosure. After the formation of the conformal layers (e.g., the first nitride layer 33, the oxide layer 34 and the second nitride layer 35), horizontal portions of the conformal layers are removed to form a first spacer 31 surrounding the first bit line structure 21 and a second spacer 32 surrounding the second bit line structure 22. In some embodiments, the removal of the horizontal portions of the conformal layers includes a wet etching operation, a dry etching operation, or a combination thereof performed to form the first spacer 31 and the second spacer 32. In some embodiments, the removal of the horizontal portions of the conformal layers includes a selective wet etching, a directional dry etching, an ion beam etching, a reactive ion etching, or a combination thereof.

In some embodiments, the horizontal portions of the second nitride layer 35, the horizontal portions of the oxide layer 34, and the horizontal portions of the first nitride layer 33 are concurrently removed by one etching operation. In some embodiments, the horizontal portions of the second nitride layer 35, the horizontal portions of the oxide layer 34, and the horizontal portions of the first nitride layer 33 are individually removed by separate etching operations. The removal of the horizontal portions of the second nitride layer 35, the oxide layer 34 and the first nitride layer 33 by multiple etching operations can be similar to the multiple etching operations of the formation of the first bit line structure 21 and the second bit line structure 22, and repeated description is omitted herein. In some embodiments, the first spacer 31 surrounds sidewalls 217 of the first bit line structure 21, and the second spacer surrounds sidewalls 227 of the second bit line structure 22, as shown in FIG. 16. In some embodiments, a top surface 261 of the first bit line structure 21 and a top surface 262 of the second bit line structure are exposed through the first spacer 31 and the second spacer 32, respectively. In some embodiments, a height of the first spacer 31 is substantially equal to a height of the first bit line structure 21, and a height of the second spacer 32 is substantially equal to a height of the second bit line structure 22.

Referring to FIGS. 17 to 20, FIGS. 17 to 20 are schematic cross-sectional diagrams at a stage of the method S1 in accordance with some embodiments of the present disclosure. In some embodiments, the operation S108 is performed after the operation S107 and includes multiple steps.

Figure 17:
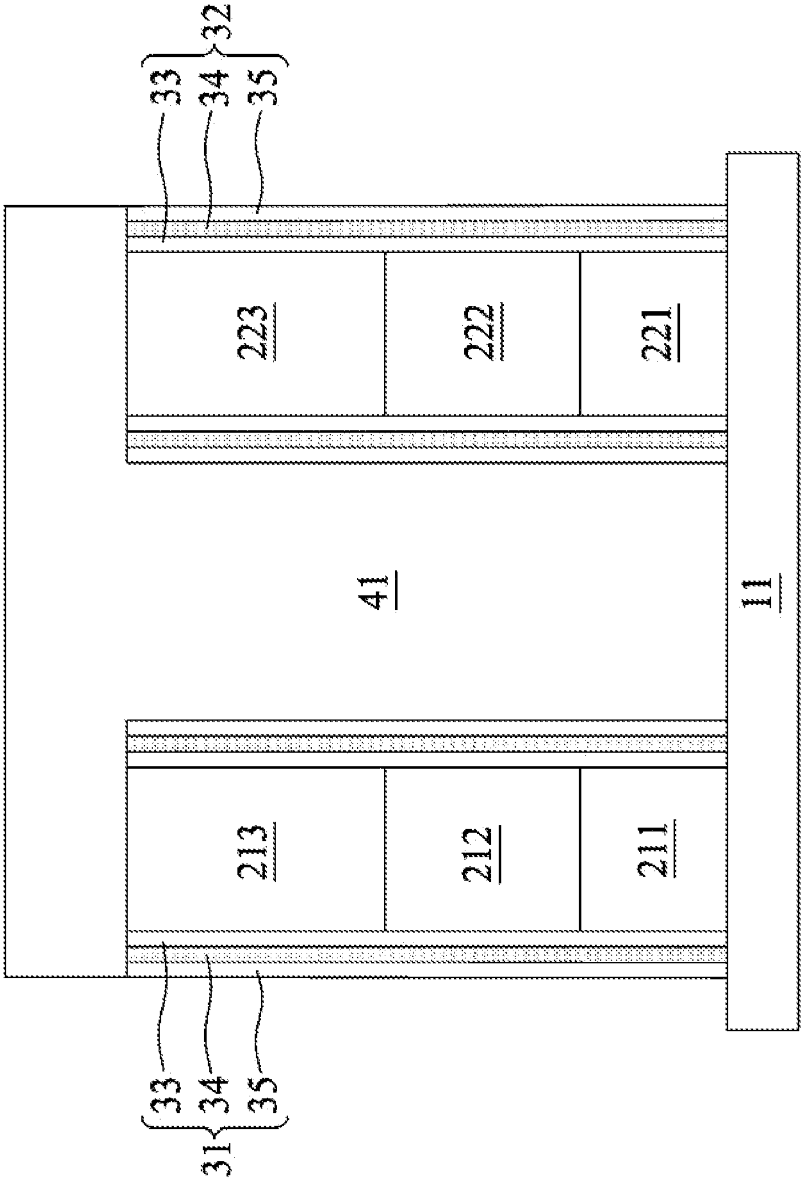

Referring to FIG. 17, FIG. 17 is a schematic cross-sectional diagram at a stage of the method S1 in accordance with some embodiments of the present disclosure. After the formation of the first spacer 31 and the second spacer 32, in operation S108, a first polysilicon layer 41 is disposed within the recess 61 and over the substrate 11. In some embodiments, the first polysilicon layer 41 is formed by a blanket deposition. In some embodiments, the blanket deposition includes a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the first polysilicon layer 41 covers the top surfaces 261 and 262 of the first bit line structure 21 and the second bit line structure 22. In some embodiments, the first polysilicon layer 41 shown in FIG. 17 includes a height substantially greater than heights of the first bit line structure 21 and the second bit line structure 22.

Figure 18:
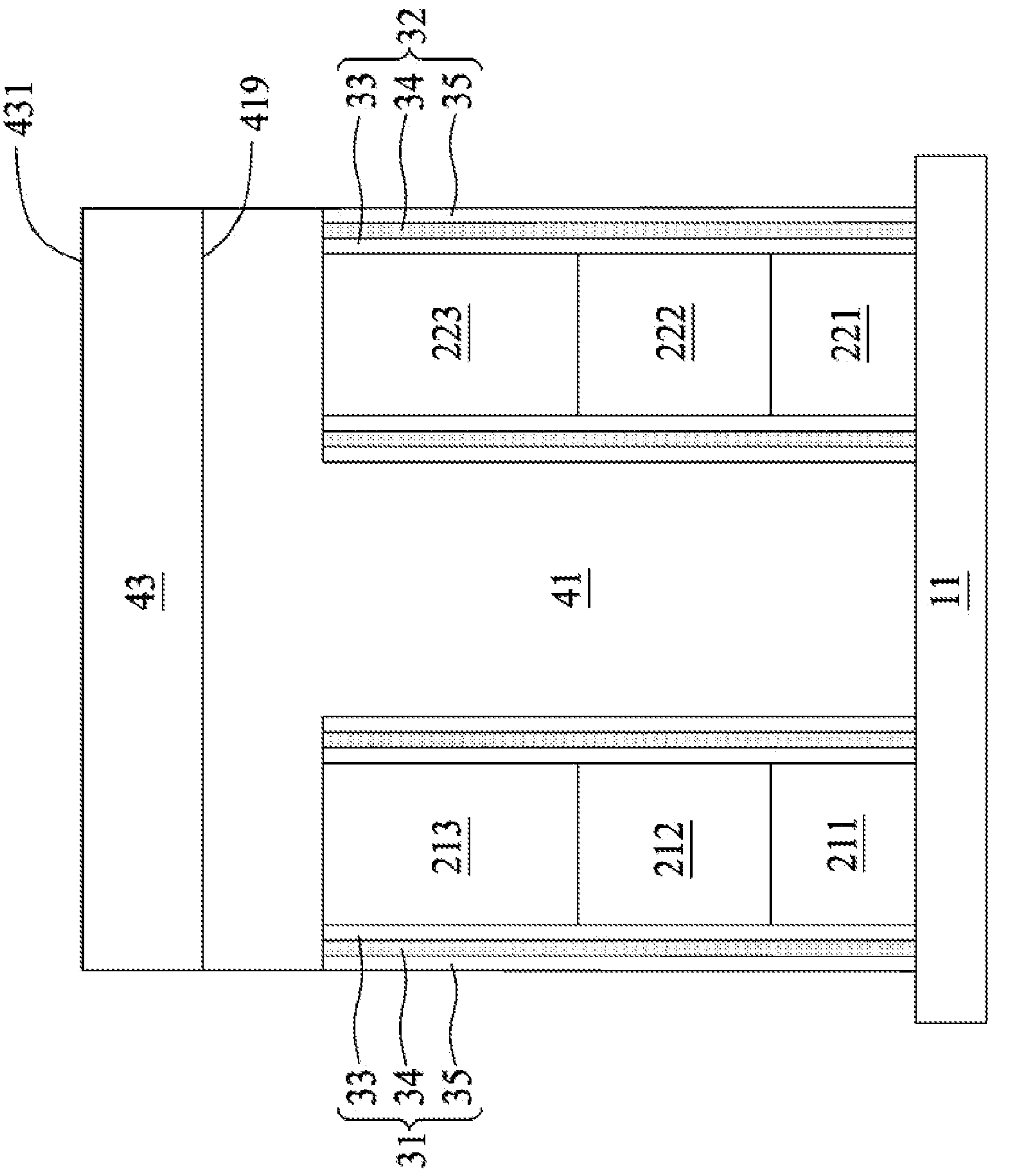

Referring to FIG. 18, FIG. 18 is a schematic cross-sectional diagram at a stage of the method S1 in accordance with some embodiments of the present disclosure. After the deposition of the first polysilicon layer 41, a sacrificial layer 43 is formed over the first polysilicon layer 41. In some embodiments, the sacrificial layer 43 at least covers a top surface 419 of the first polysilicon layer 41. It should be noted that FIG. 18 shows only a portion of the first polysilicon layer 41, and the top surface 419 of the first polysilicon layer 41 may be a non-planar surface. The sacrificial layer 43 is configured to provide a planar surface for an etching or polishing operation to be performed in subsequent processing to provide a better result of planarization. In some embodiments, the sacrificial layer 43 has a top surface 431, and the top surface 431 is planar. The sacrificial layer 43 is for a purpose of compensation of uneven portions of the top surface 419 of the first polysilicon layer 41. In some embodiments, the sacrificial layer 43 includes a dielectric material, an anti-reflective coating material, an oxide-containing material, or other suitable materials. In some embodiments, the sacrificial layer 43 includes silicate glass, silicon oxide, silane oxide, or a combination thereof. In some embodiments, the sacrificial layer 43 includes borophosphosilicate glass (BPSG). In some embodiments, the sacrificial layer 43 includes a dielectric material different from that of the first dielectric layer 213 of the first bit line structure 21 or the third dielectric layer 223 of the second bit line structure 22. In some embodiments, the sacrificial layer 43 includes a dielectric material different from that of the second nitride layer 35 of the first spacer 31 or the second spacer 32. In some embodiments, the sacrificial layer 43 includes silicon.

Figure 19:
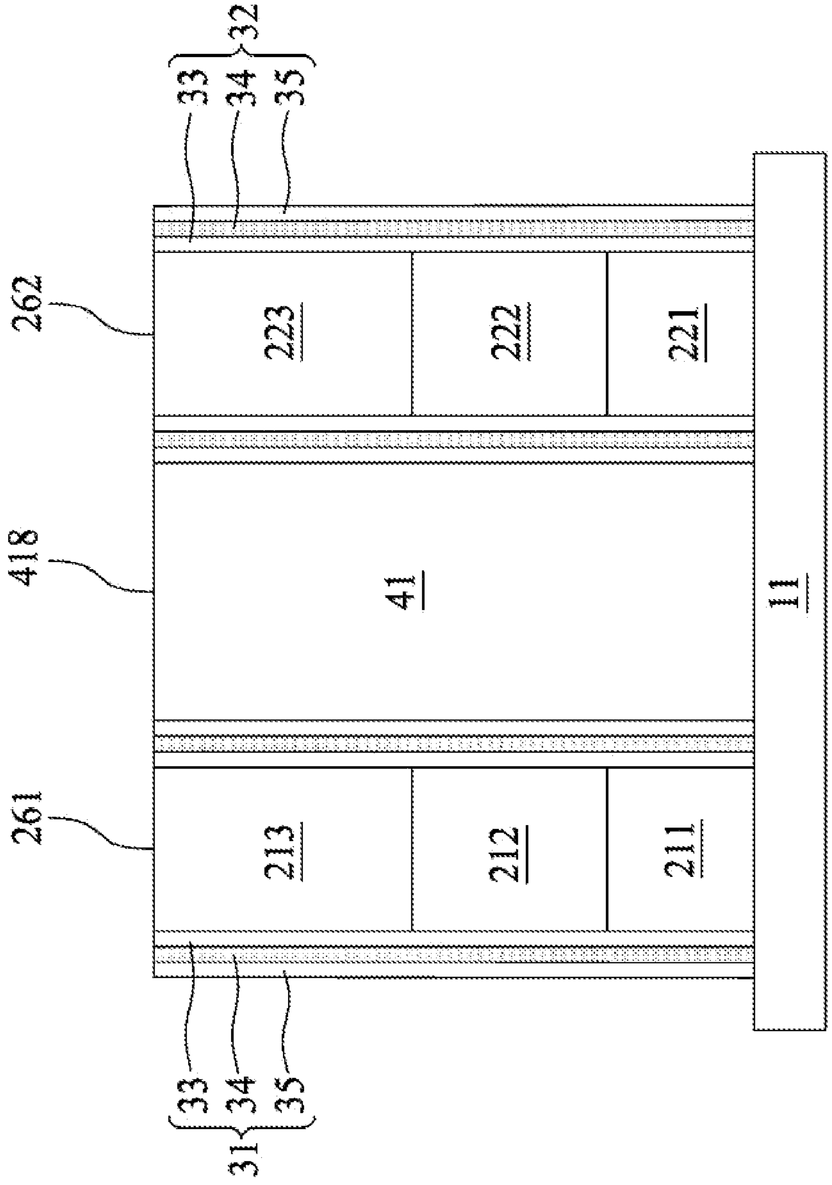

Referring to FIG. 19, FIG. 19 is a schematic cross-sectional diagram at a stage of the method S1 in accordance with some embodiments of the present disclosure. After the formation of the sacrificial layer 43, a planarization is performed on the sacrificial layer 43 and the first polysilicon layer 41. In some embodiments, the planarization includes ion beam etching, directional dry etching, reactive ion etching, solution wet etching, chemical mechanical polishing (CMP), or a combination thereof. In some embodiments, the planarization has a high selectivity to a material of the sacrificial layer 43. In some embodiments, the planarization has a high selectivity to a material of the first polysilicon layer 41. In some embodiments, the planarization has a low selectivity to a material of the first dielectric layer 213 and/or a material of the first spacer 31. In some embodiments, the planarization stops upon an exposure of the top surface 261 of the first bit line structure 21 and the top surface 262 of the second bit line structure 22. In some embodiments, a top surface 418 of the polysilicon layer 41 is substantially coplanar with the top surface 261 of the first bit line structure 21 and the top surface 262 of the second bit line structure 22.

Figure 20:
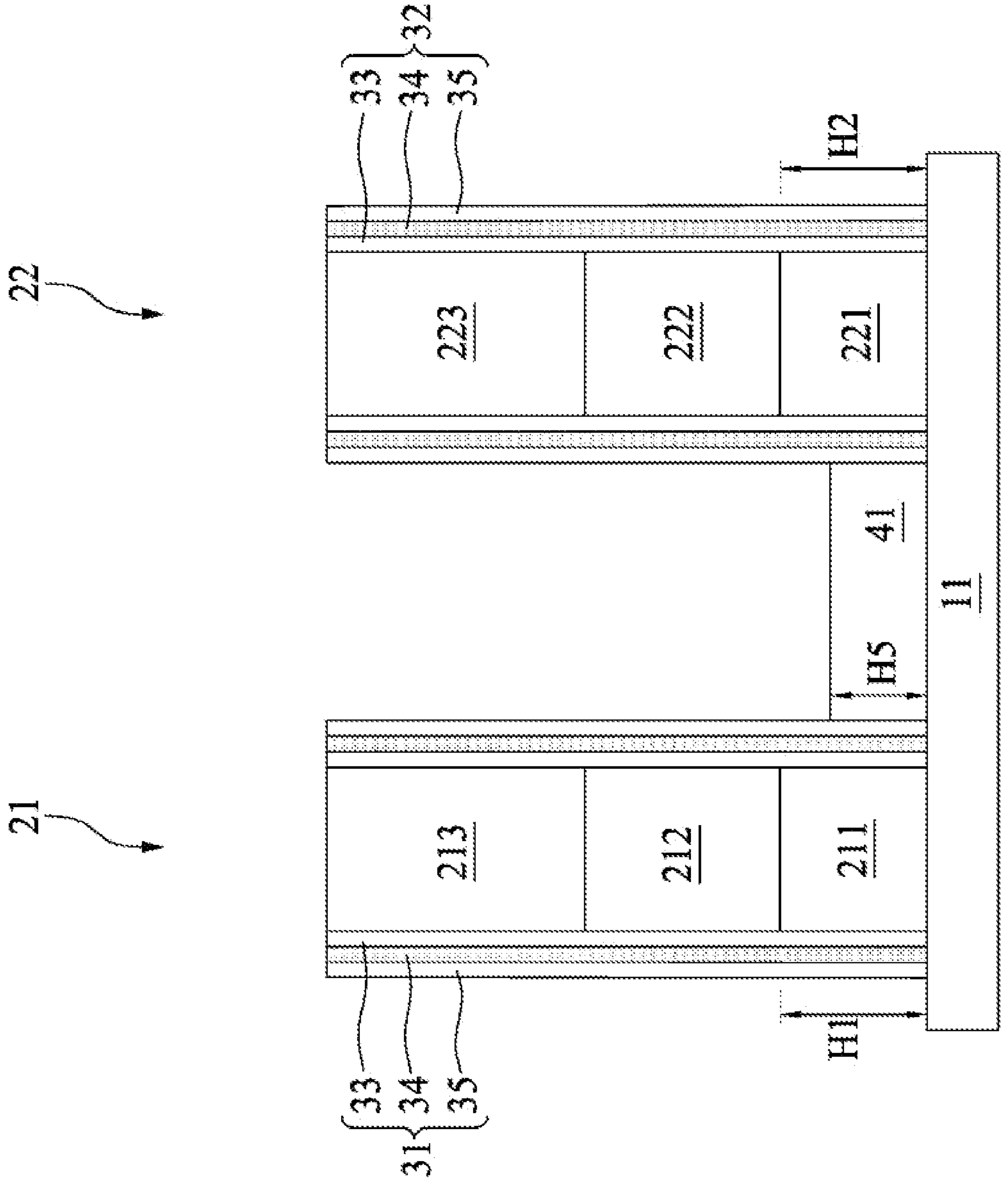

Referring to FIG. 20, FIG. 20 is a schematic cross-sectional diagram at a stage of the method S1 in accordance with some embodiments of the present disclosure. After the planarization is performed on the sacrificial layer 43 and the first polysilicon layer 41, portions of the first polysilicon layer are removed. In some embodiments, the removal of the portions of the first polysilicon layer 41 includes etching or any other suitable process. In some embodiments, a height H5 of the first polysilicon layer 41 is obtained after the removal of the portions of the first polysilicon layer. In some embodiments, the height H5 is less than the height H1 of the first conductive layer 211 of the first bit line structure 21, or is less than the height H2 of the second dielectric layer 221 of the second bit line structure 22. In some embodiments, the first bit line structure 21 or the second bit line structure 22 protrudes from and is exposed through the first polysilicon layer 41 after the removal of the portions of the first polysilicon layer 41.

Figure 21:
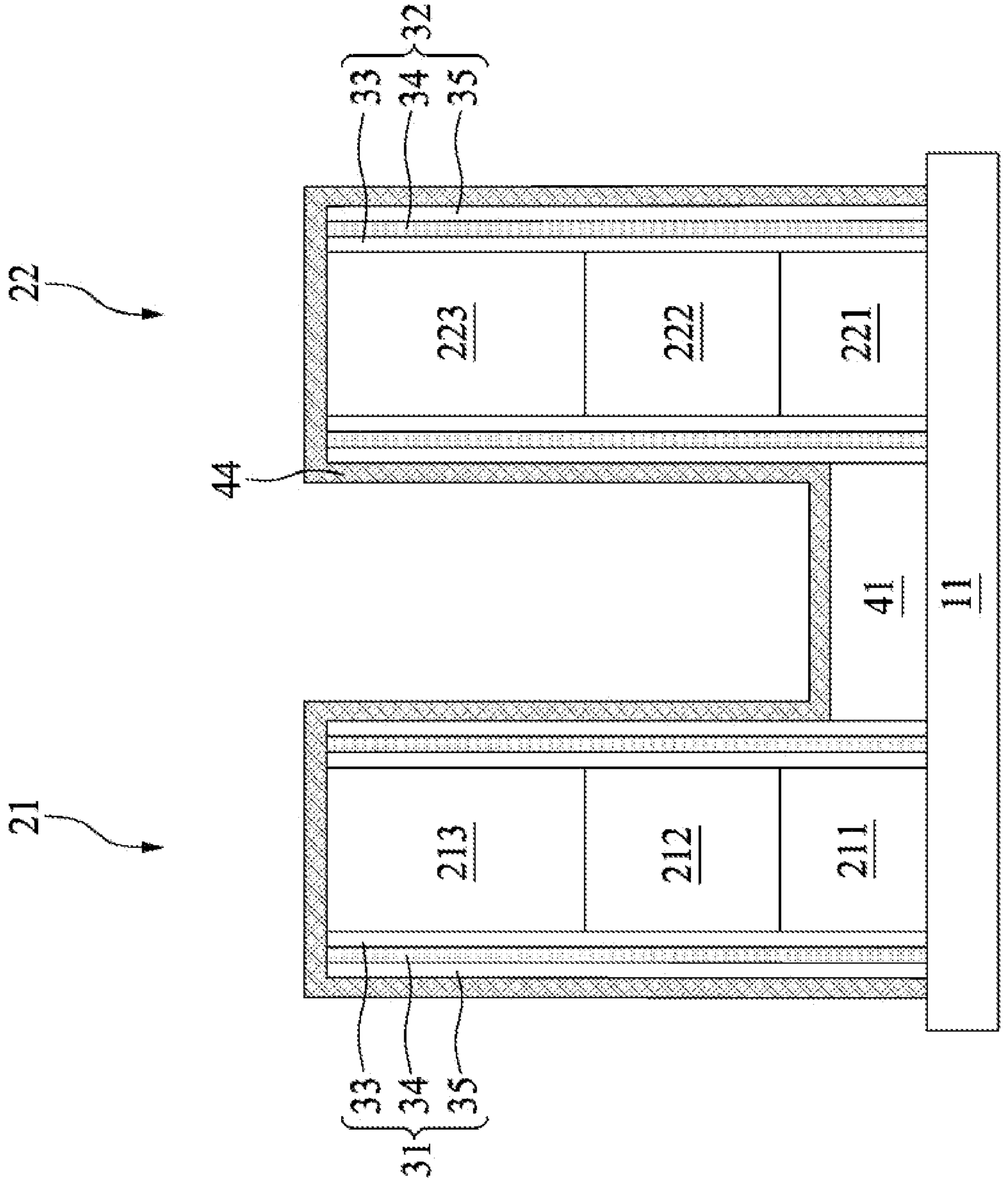
Figure 22:
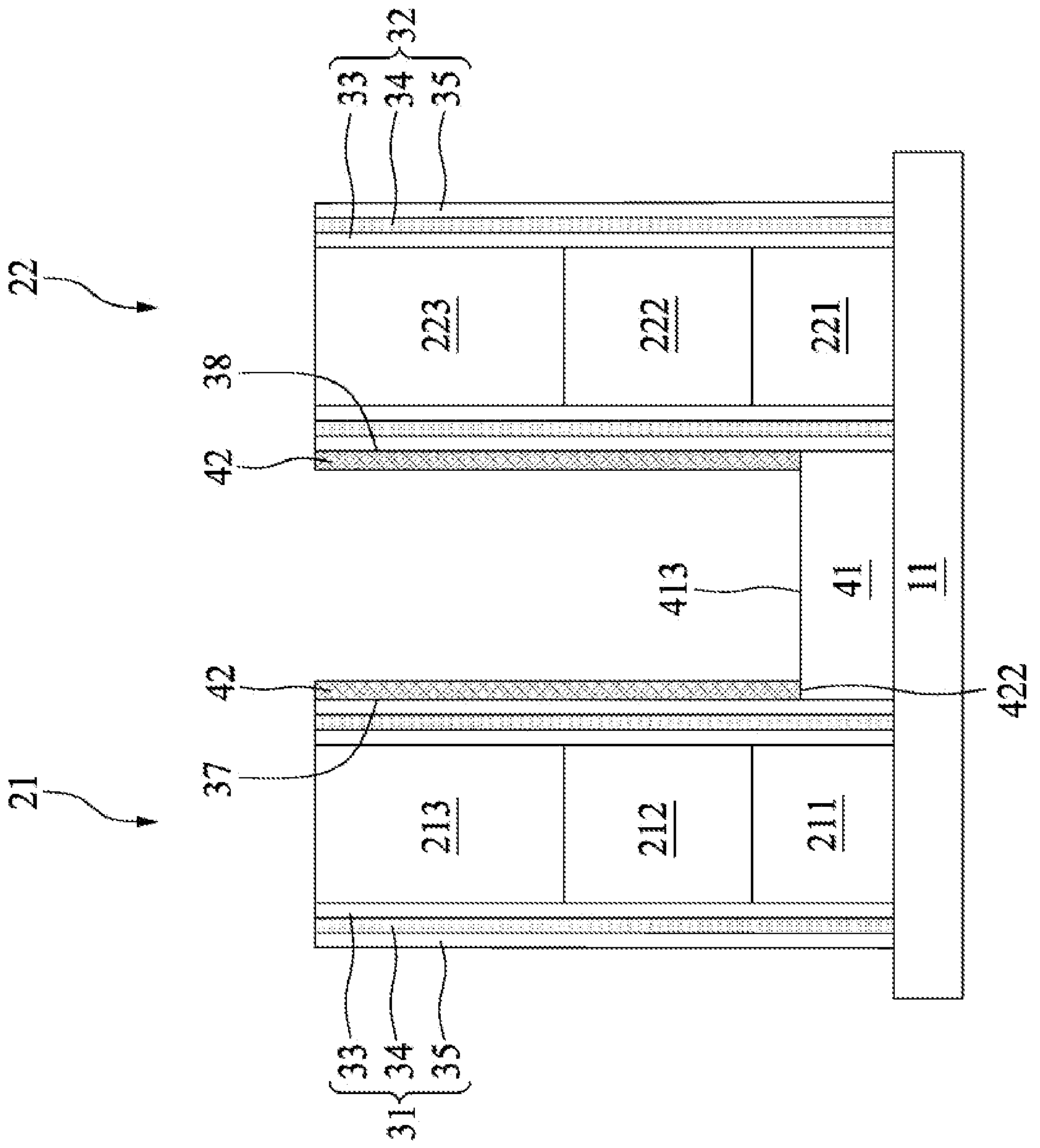

Referring to FIGS. 21 to 22, FIGS. 21 to 22 are schematic cross-sectional diagrams at a stage of the method S1 in accordance with some embodiments of the present disclosure. In some embodiments, the operation S109 is performed after the operation S108 and includes multiple steps.

Referring to FIG. 21, FIG. 21 is a schematic cross-sectional diagram at a stage of the method S1 in accordance with some embodiments of the present disclosure. After the deposition of the first polysilicon layer 41, a fourth dielectric layer 44 is formed over the first bit line structure 21, the second bit line structure 22, the first spacer 31, the second spacer 32 and the first polysilicon layer 41.

In some embodiments, the fourth dielectric layer 44 includes a dielectric material. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon-based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure. In some embodiments, the fourth dielectric layer 44 is formed by a conformal deposition.

Referring to FIG. 22, FIG. 22 is a schematic cross-sectional diagram at a stage of the method S1 in accordance with some embodiments of the present disclosure. After the deposition of the fourth dielectric layer 44, horizontal portions of the fourth dielectric layer 44 are removed to form a dielectric liner 42 along a sidewall 37 of the first spacer 31, along a sidewall 38 of the second spacer 32, and over the first polysilicon layer 41. In some embodiments, the removal of the horizontal portions of the fourth dielectric layer 44 includes a wet etching operation, a dry etching operation, or a combination thereof performed to form the dielectric liner 42. In some embodiments, the removal of the horizontal portions of the fourth dielectric layer 44 includes a selective wet etching, a directional dry etching, an ion beam etching, a reactive ion etching, or a combination thereof. In some embodiments, a bottom surface 422 of the dielectric liner 42 is substantially coplanar with a top surface 413 of the first polysilicon layer 41.

Figure 23:
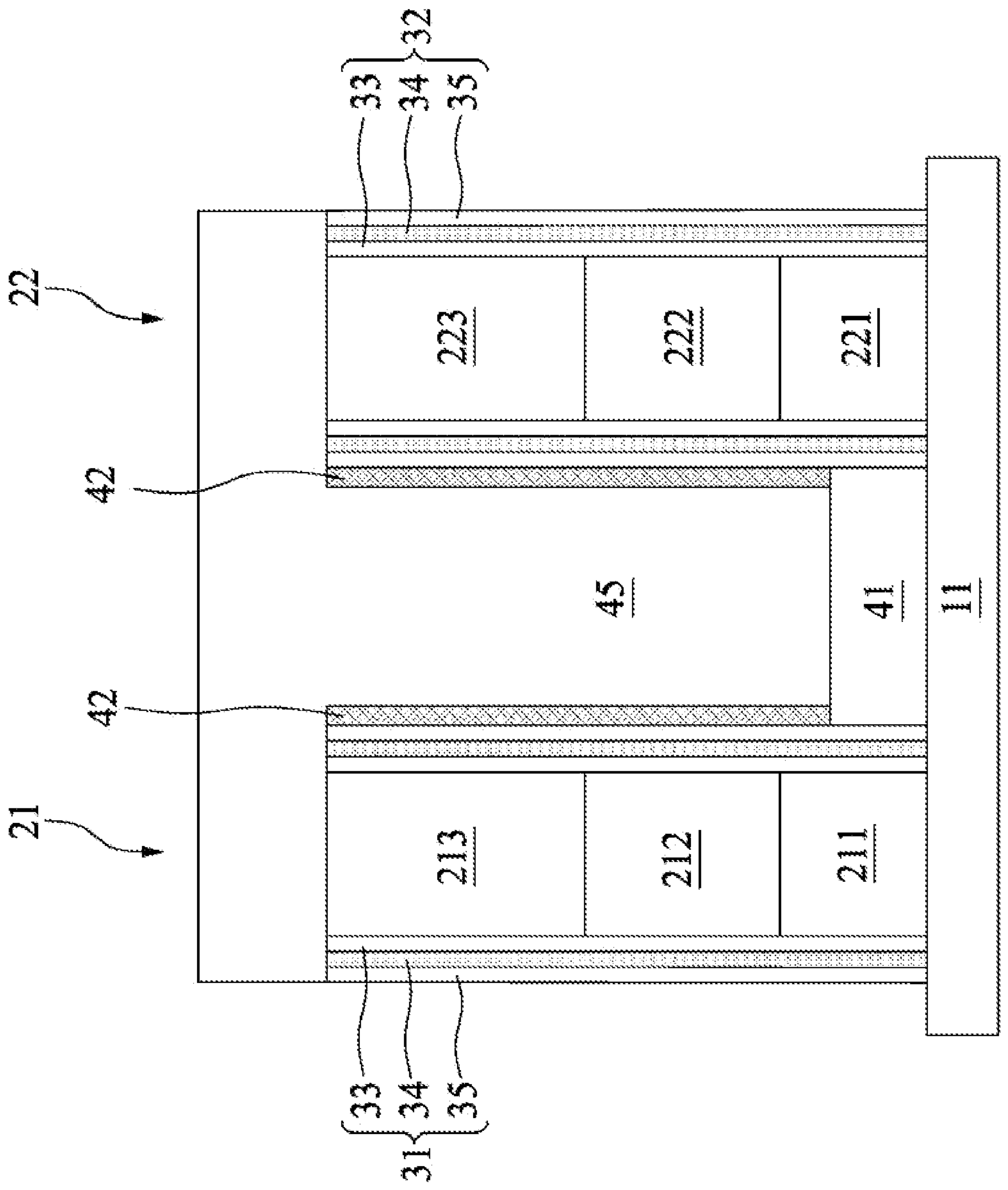
Figure 24:
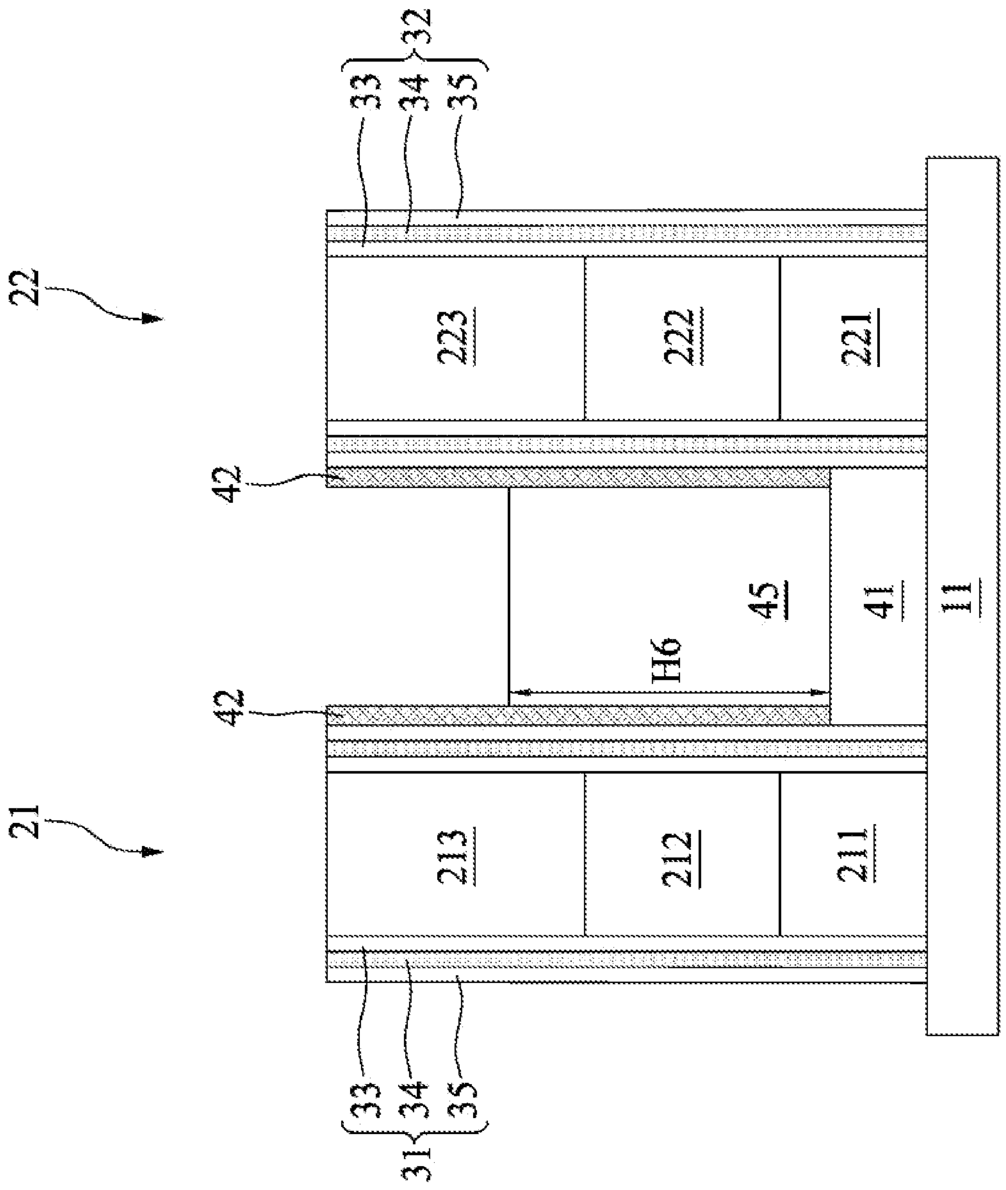

Referring to FIGS. 23 to 24, FIGS. 23 to 24 are schematic cross-sectional diagrams at a stage of the method S1 in accordance with some embodiments of the present disclosure. In some embodiments, the operation S110 is performed after the operation S109 and includes multiple steps.

Referring to FIG. 23, FIG. 23 is a schematic cross-sectional diagram at a stage of the method S1 in accordance with some embodiments of the present disclosure. After the formation of the dielectric liner 42, a second polysilicon layer 45 is disposed over the first bit line structure 21, the first spacer 31, the dielectric liner 42, the first polysilicon layer 41, the second bit line structure 22 and the second spacer 32. In some embodiments, the first polysilicon layer 41 and the second polysilicon layer 45 include a same material.

Referring to FIG. 24, FIG. 24 is a schematic cross-sectional diagram at a stage of the method S1 in accordance with some embodiments of the present disclosure. After the deposition of the second polysilicon layer 45, in operation S110, portions of the second polysilicon layer 45 are removed to form the second polysilicon layer 45. In some embodiments, a height H6 of the second polysilicon layer 45 is obtained after the removal of the portions of the second polysilicon layer 45. In some embodiments, the first bit line structure 21 and the second bit line structure 22 protrude from and are exposed through the second polysilicon layer 45 after the removal of the portions of the second polysilicon layer 45.

Figure 25:
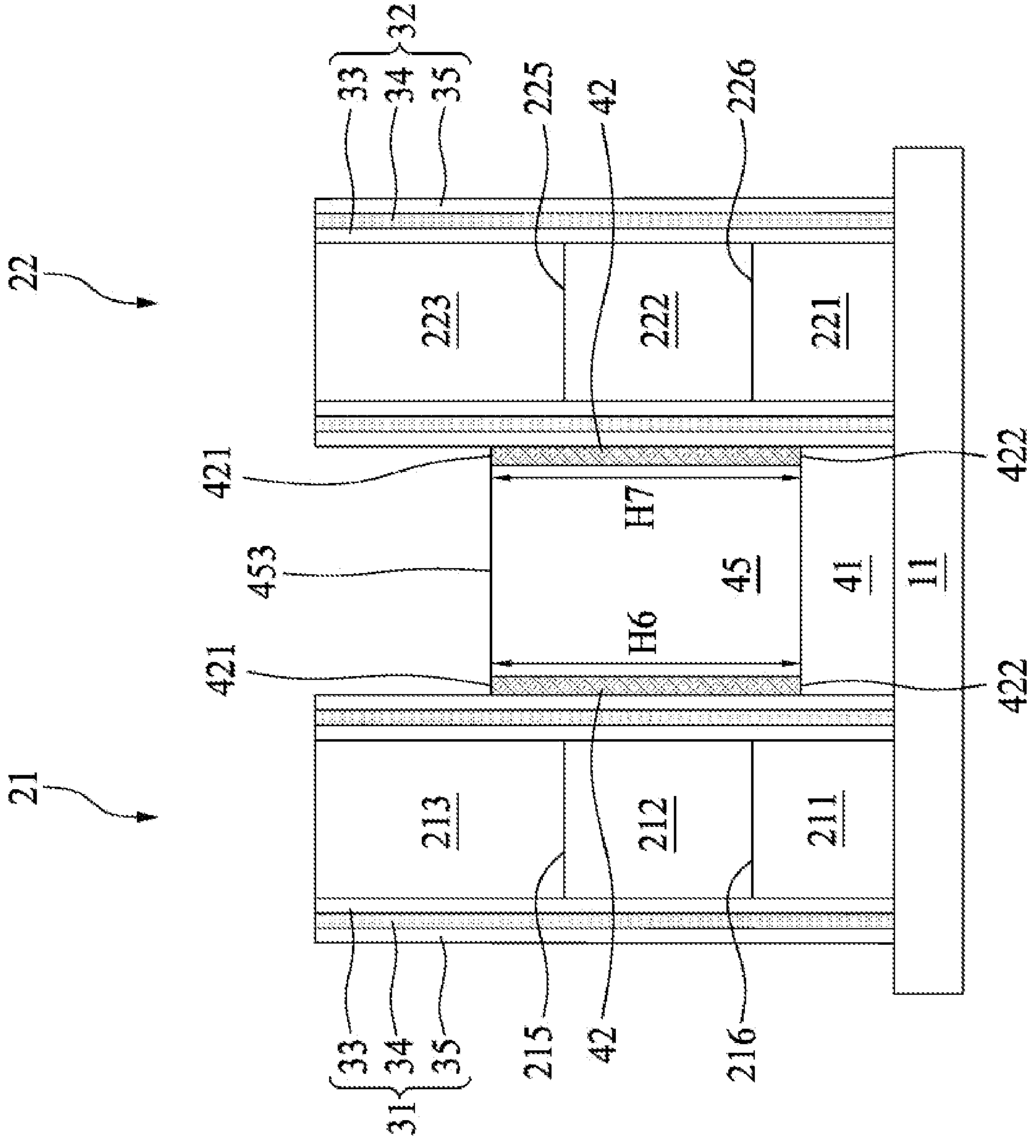

Referring to FIG. 25, FIG. 25 is a schematic cross-sectional diagram at a stage of the method S1 in accordance with some embodiments of the present disclosure. In some embodiments, the operation S111 is performed after the operation S110. After the formation of the second polysilicon layer 45, portions of the dielectric liner 42 are removed. In some embodiments, a height H7 of the dielectric liner 42 is obtained after the removal of the portions of the dielectric liner 42. In some embodiments, the height H7 of the dielectric liner 42 is substantially equal to the height H6 of the second polysilicon layer. In some embodiments, a top surface 453 of the second polysilicon layer 45 is substantially coplanar with a top surface 421 of the dielectric liner 42.

In some embodiments, the top surface 421 of the dielectric liner 42 is higher than a top surface 215 of the second conductive layer 212 of the first bit line structure 21, and a bottom surface 422 of the dielectric liner 42 is lower than a bottom surface 216 of the second conductive layer 212 of the first bit line structure 21. In other words, a height of the dielectric liner 42 is substantially greater than a height of the second conductive layer 212 of the first bit line structure 21.

In some embodiments, the top surface 421 of the dielectric liner 42 is higher than a top surface 225 of the third conductive layer 222, and the bottom surface 422 of the dielectric liner 42 is lower than a bottom surface 226 of the third conductive layer 222. In other words, the height of the dielectric liner 42 is substantially greater than a height of the third conductive layer 222 of the second bit line structure 22.

Figure 26:
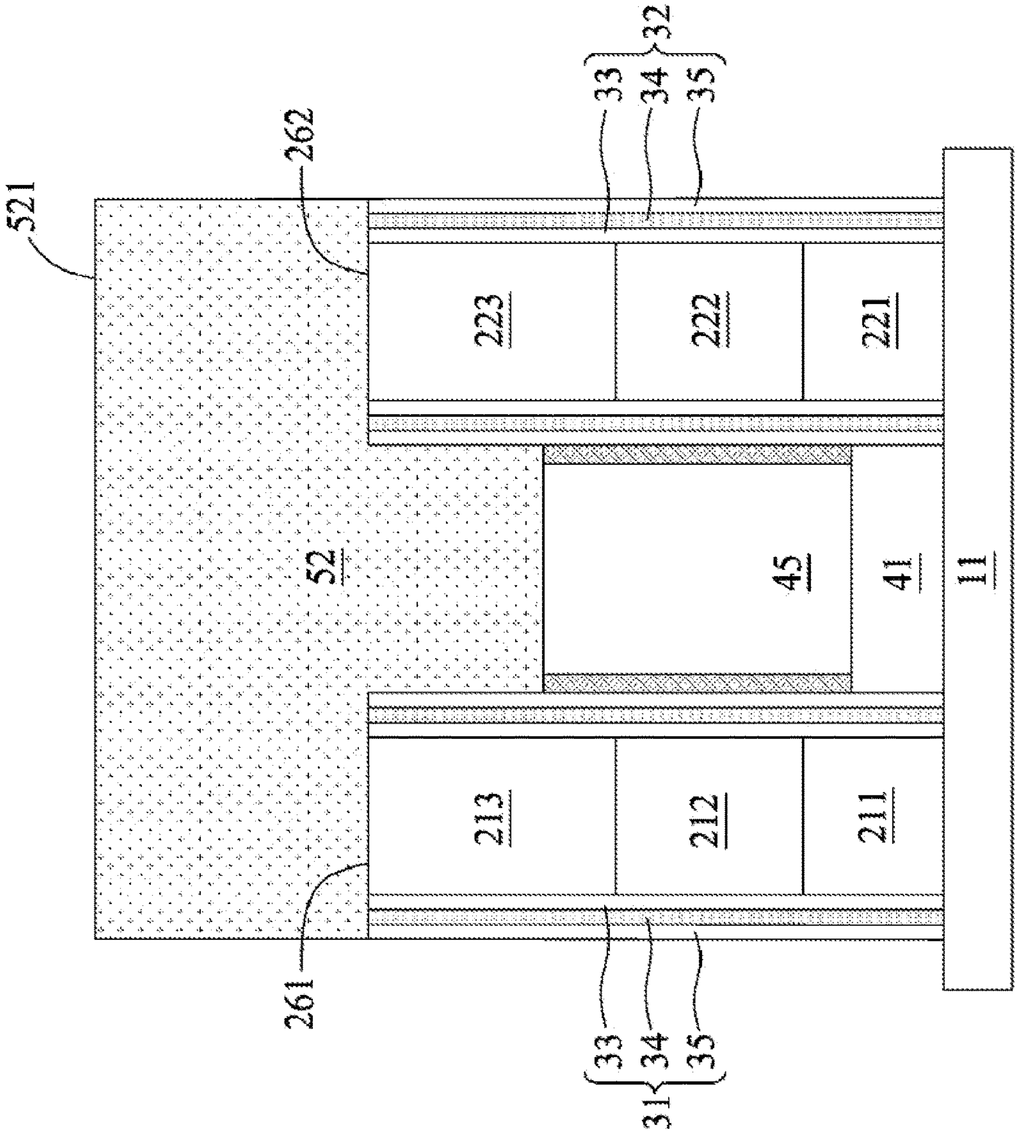

Referring to FIG. 26, FIG. 26 is a schematic cross-sectional diagram at a stage of the method S1 in accordance with some embodiments of the present disclosure. After the removal of the portions of the dielectric liner 42, the method S1 further includes forming a metallic layer 52 covering the first bit line structure 21, the second bit line structure 22, the first spacer 31, the second spacer 32, the dielectric liner 42 and the second polysilicon layer 45. In some embodiments, the metallic layer 52 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the metallic layer 52 includes tungsten, copper, or a combination thereof. In some embodiments, the metallic layer 52 is formed by CVD, PVD, LPCVD, PECVD, a sputtering operation, electroplating, or a combination thereof. In some embodiments, the metallic layer 52 at least covers the top surface 261 of the first bit line structure 21 and the top surface 262 of the second bit line structure 22. It should be noted that FIG. 26 shows only a portion of the metallic layer 52, and a top surface 521 of the metallic layer 52 may be a non-planar surface.

Figure 27:
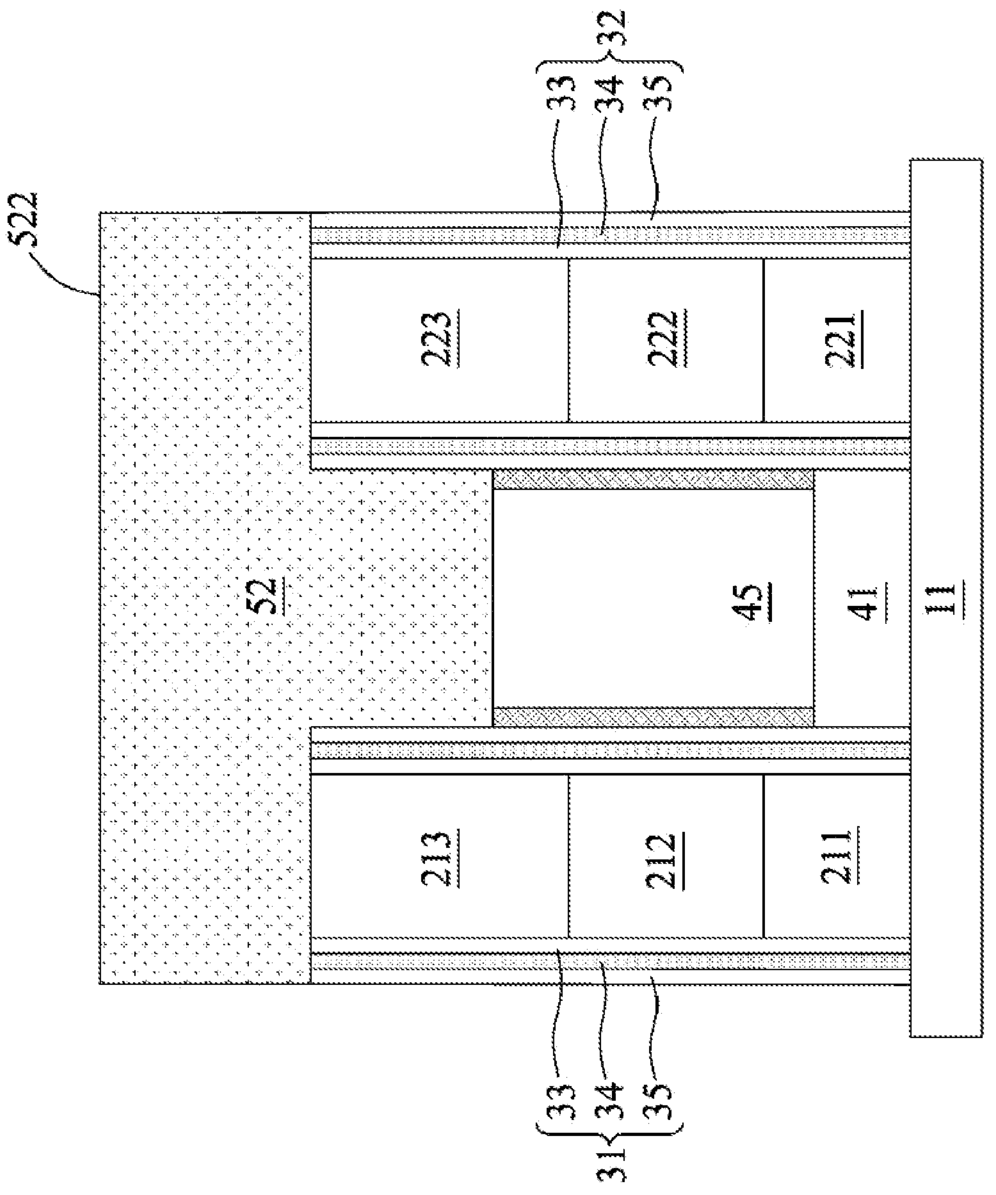

Referring to FIG. 27, FIG. 27 is a schematic cross-sectional diagram at a stage of the method S1 in accordance with some embodiments of the present disclosure. After the formation of the metallic layer 52, the method S1 may further include a planarization. In some embodiments, the planarization includes ion beam etching, directional dry etching, reactive ion etching, solution wet etching, CMP, or a combination thereof. In some embodiments, the planarization includes a polishing operation (e.g., a CMP operation). In some embodiments, a top surface 522 of the metallic layer 52 is formed after the planarization. In some embodiments, the top surface 522 is a planar surface disposed at an elevation lower than the top surface 521 shown in FIG. 26.

Figure 28:
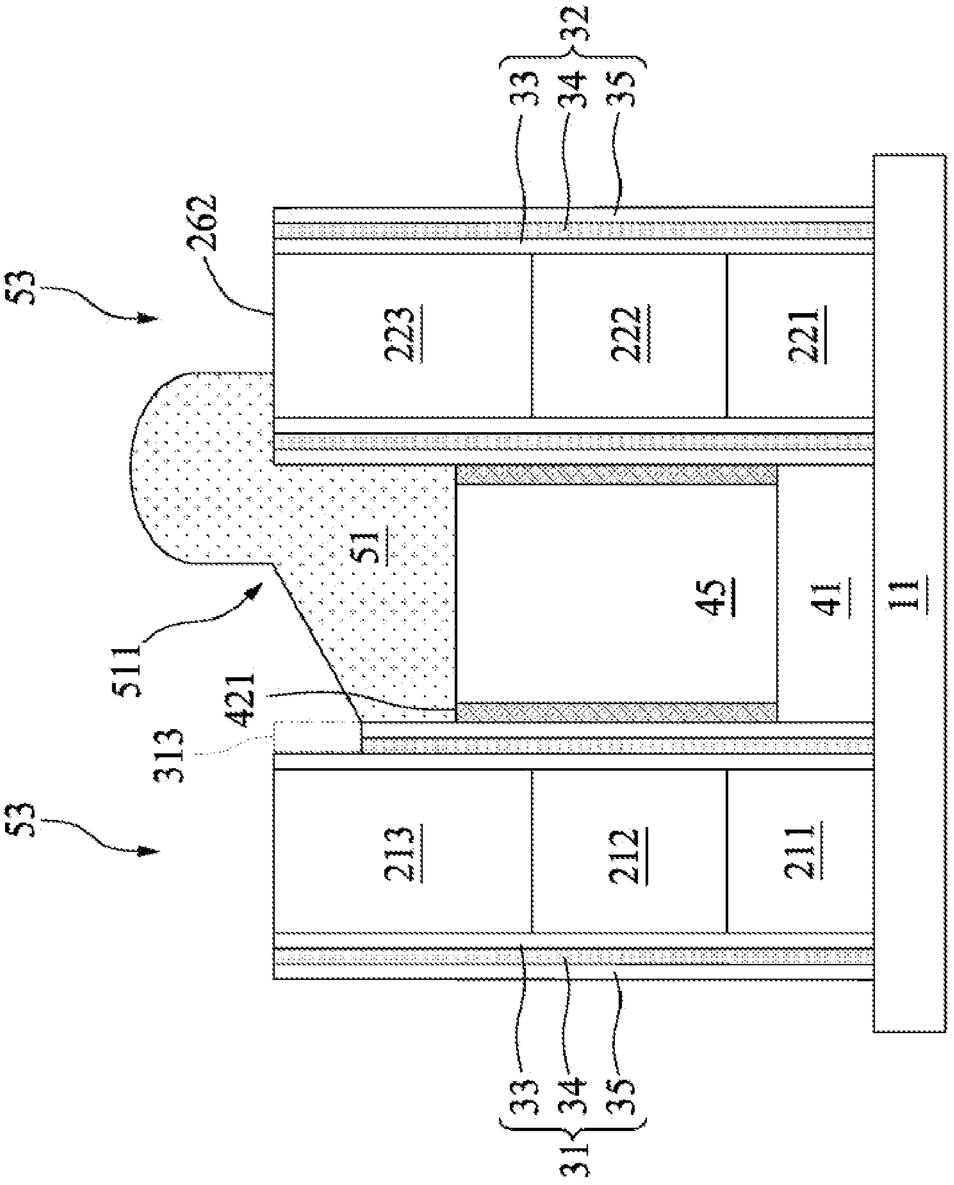

Referring to FIG. 28, FIG. 28 is a schematic cross-sectional diagram at a stage of the method S1 in accordance with some embodiments of the present disclosure. After the planarization, the method S1 may further include removing portions of the metallic layer 52 to form a landing pad 51. In some embodiments, a plurality of openings 53 are formed on the metallic layer 52 and thereby define a plurality of landing pads 51. In some embodiments, an upper portion 313 of the first spacer 31 surrounding the first bit line structure 21 is partially removed during the removal of the portions of the metallic layer 52. In some embodiments, the first spacer 31 and portions of the second spacer 32 are exposed through the plurality of openings 53. In alternative embodiments, only portions of the metallic layer 52 are removed. In some embodiments, configurations of the first bit line structure 21, the second bit line structure 22, the first spacer 31 and the second spacer 32 remain the same before, during and after the removal of the portions of the metallic layer 52.

In some embodiments, the landing pad 51 is disposed over the second polysilicon layer 45 and the second bit line structure 22, and includes a neck portion 511 aligned with the top surface 262 of the second bit line structure 22. In some embodiments, the top surface 421 of the dielectric liner 42 is below the neck portion 511 of the landing pad 51.

Figure 29:
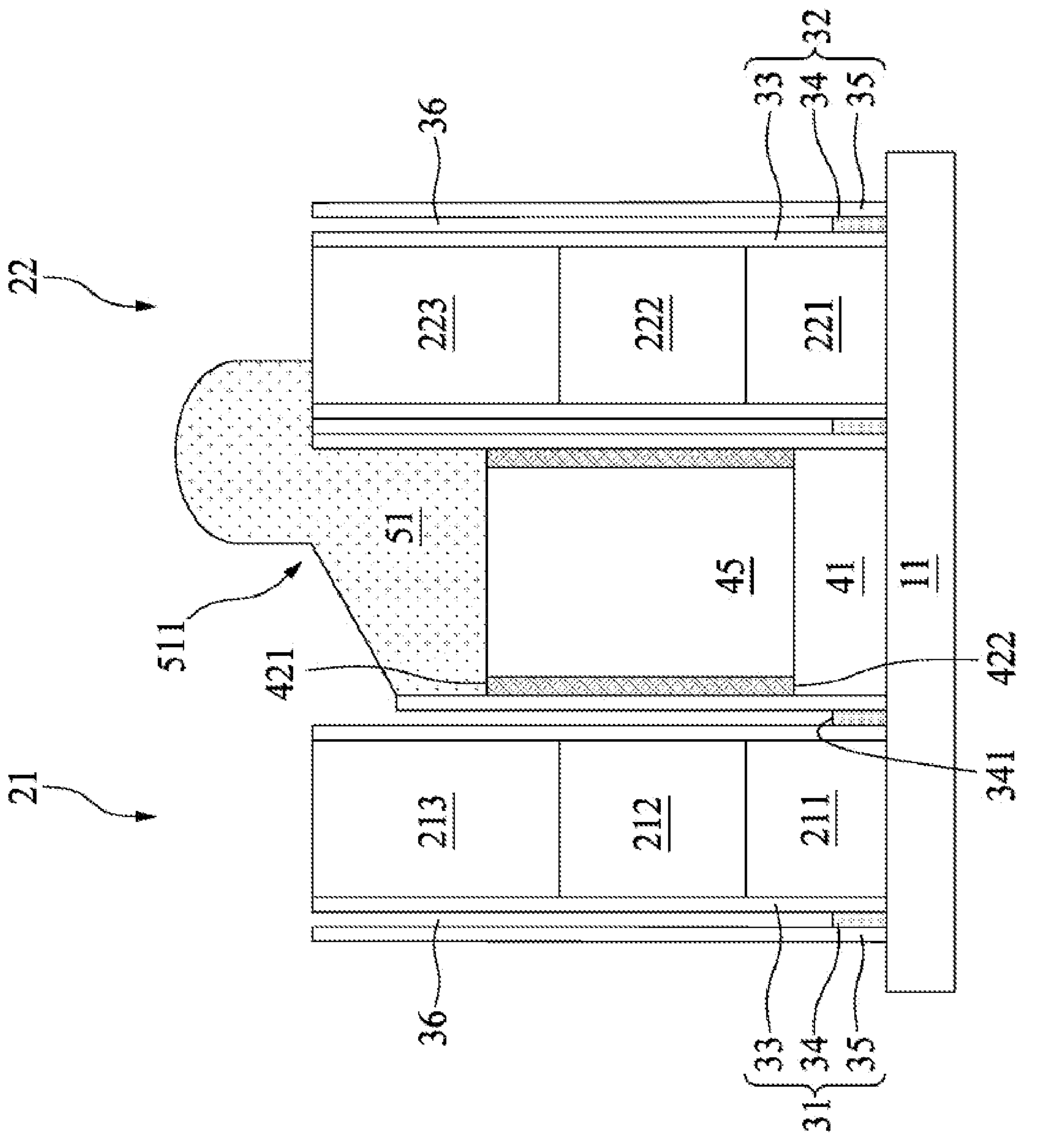

Referring to FIG. 29, FIG. 29 is a schematic cross-sectional diagram at a stage of the method S1 in accordance with some embodiments of the present disclosure. After the formation of the landing pad 51, the method S1 may further include removing portions of the oxide layer 34 to form an air gap 36 surrounded by the first nitride layer 33, the second nitride layer 35 and the oxide layer 34. The air gap 36 is thereby formed in place of the removed portion of the oxide layer 34. In some embodiments, the removal of the portions of the oxide layer 34 includes vapor etching, solution wet etching, or a combination thereof. In some embodiments, vapor-phase hydrogen fluoride (HF) is used to remove the portions of the oxide layer 34. In some embodiments, a top surface 341 of the oxide layer 34 is lower than the bottom surface 422 of the dielectric liner 42. A semiconductor structure similar to that shown in FIG. 1 is thereby formed.

Figure 30:
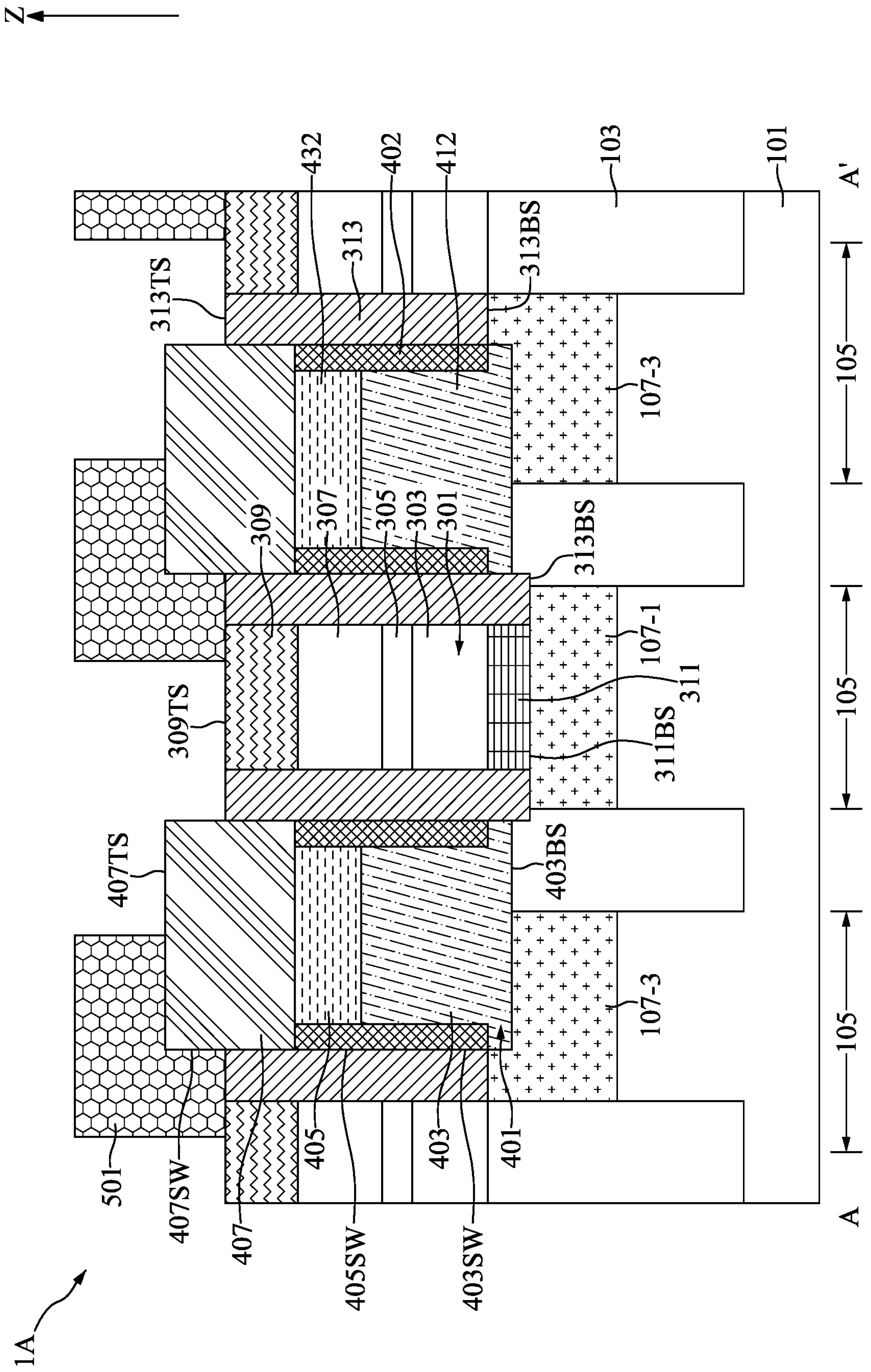
FIG. 30 is a schematic cross-sectional diagram of a semiconductor structure in accordance with alternative embodiments of the present disclosure.

Referring to FIG. 30, FIG. 30 is a schematic cross-sectional diagram of a semiconductor structure 1A in accordance with alternative embodiments of the present disclosure. The semiconductor structure 1A may include a substrate 101, a bit line structure 301 disposed on the substrate 101, a capacitor contact structure 401 disposed next to the bit line structure 301, and a landing pad layer 501 disposed covering a portion of a top surface 407TS of the capacitor contact structure 401 and an upper portion of a sidewall 407SW of the capacitor contact structure 401. The semiconductor structure 1A in FIG. 30 and the semiconductor structure in FIG. 1 are similar in many aspects, and thus descriptions of similar features will not be repeated herein. Main differences are described below.

The substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

In some embodiments, an isolation layer 103 may be formed in the substrate 101, and active areas 105 may be defined by the isolation layer 103. A top surface of the isolation layer 103 may be substantially coplanar with a top surface of the substrate 101. The isolation layer 103 may be formed of, for example, an insulating material such as silicon oxide, silicon nitride, silicon oxynitride, silicon nitride oxide, or fluoride-doped silicate. It should be noted that, in the present disclosure, silicon oxynitride refers to a substance that contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen. In some embodiments, source/drain regions 107-1 and 107-3 may be formed in upper portions of the active areas 105. The source/drain regions 107-1, 107-3 may be doped with a dopant such as phosphorus, arsenic, antimony, or boron.

The bit line structure 301 may include a bit line bottom conductive layer 303 disposed over the substrate 101, a bit line middle conductive layer 305 disposed over the bit line bottom conductive layer 303, and a bit line top conductive layer 307 disposed over the bit line middle conductive layer 305. The bit line bottom conductive layer 303 may be formed of, for example, polycrystalline silicon, polycrystalline germanium, polycrystalline silicon germanium, titanium, tantalum, tungsten, copper, aluminum, tungsten silicide, cobalt silicide, or titanium silicide. The bit line middle conductive layer 305 may be formed of, for example, titanium nitride or tantalum nitride. The bit line top conductive layer 307 may be formed of, for example, tungsten, tantalum, titanium, copper, or aluminum. The bit line middle conductive layer 305 may reduce or possibly prevent a conductive material in the bit line top conductive layer 307 from diffusing toward the bit line bottom conductive layer 303.

In some embodiments, the semiconductor structure 1A further includes a bit line contact 311 formed in the substrate 101, wherein the bit line structure 301 may be disposed on the bit line contact 311. The bit line contacts 311 may be respectively correspondingly formed in the source regions 107-1. A top surface of the bit line contact 311 may be substantially coplanar with the top surface of the substrate 101. The bit line contact 311 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bit line contact 311 may electrically couple to the source regions 107-1.

In some embodiments, the semiconductor structure 1A further includes bit line spacers 313 disposed protruding from the substrate 101 and attached to sidewalls of the bit line structure 301. The bit line spacers 313 may be made of silicon oxide, silicon nitride, silicon carbon nitride, silicon nitride oxide, or silicon oxynitride. In some embodiments, some portions of a bottom surface 313BS of the bit line spacer 313 may be substantially coplanar with a bottom surface 311BS of the bit line contact 311.

In some embodiments, the semiconductor structure 1A further includes a bit line capping layer 309 over the substrate 101 and on the bit line structure 301. A top surface 309TS of the bit line capping layer 309 may be referred to as a top surface of the bit line structure 301. The bit line capping layer 309 may be formed of, for example, silicon nitride, silicon nitride oxide, silicon oxynitride, boron nitride, silicon boron nitride, phosphorus boron nitride, or boron carbon silicon nitride.

The capacitor contact structure 401 may protrude from the substrate 101. The capacitor contact structure 401 includes a capacitor contact bottom conductive layer 403 protruding from the substrate 101, a capacitor contact middle conductive layer 405 disposed on the capacitor contact bottom conductive layer 403, and a capacitor contact top conductive layer 407 disposed on the capacitor contact middle conductive layer 405. The top surface 407TS of the capacitor contact top conductive layer 407 may be referred to as the top surface of the capacitor contact structure 401. The capacitor contact structure 401 may be electrically coupled to the drain region 107-3. The capacitor contact bottom conductive layer 403 may be formed of, for example, polycrystalline silicon, polycrystalline germanium, or polycrystalline silicon germanium. In some embodiments, the capacitor contact bottom conductive layer 403 may be doped with a dopant such as phosphorus, arsenic, antimony, or boron. The capacitor contact middle conductive layer 405 may be formed of, for example, cobalt silicide, titanium silicide, nickel silicide, nickel platinum silicide, or tantalum silicide. A top surface of the capacitor contact middle conductive layer 405 may be at a vertical level lower than a vertical level of the top surface 309TS of the bit line capping layer 309.

In some embodiments, the semiconductor structure 1A further includes a dielectric liner 402 surrounding at least a portion 412 of the capacitor contact bottom conductive layer 403 and a portion 432 of the capacitor contact middle conductive layer 405. In some embodiments, the bit line spacer 313 surrounds the capacitor contact bottom conductive layer 403, the capacitor contact middle conductive layer 405, the capacitor contact top conductive layer 407 and the dielectric liner 402. In some embodiments, the dielectric liner 402 is disposed along a sidewall 403SW of the capacitor contact bottom conductive layer 403 and along a sidewall 405SW of the capacitor contact middle conductive layer 405.

The landing pad layer 501 may be formed partially covering the capacitor contact structure 401. The landing pad layer 501 may cover a portion of the top surface 407TS of the capacitor contact top conductive layer 407 and an upper portion of the sidewall 407SW of the capacitor contact top conductive layer 407. In other words, the landing pad layer 501 may partially cover the capacitor contact top conductive layer 407. The landing pad layer 501 may be formed of tungsten, copper, or aluminum. A photolithography process and a subsequent etching process may be performed to form the landing pad layer 501.

Figure 31:
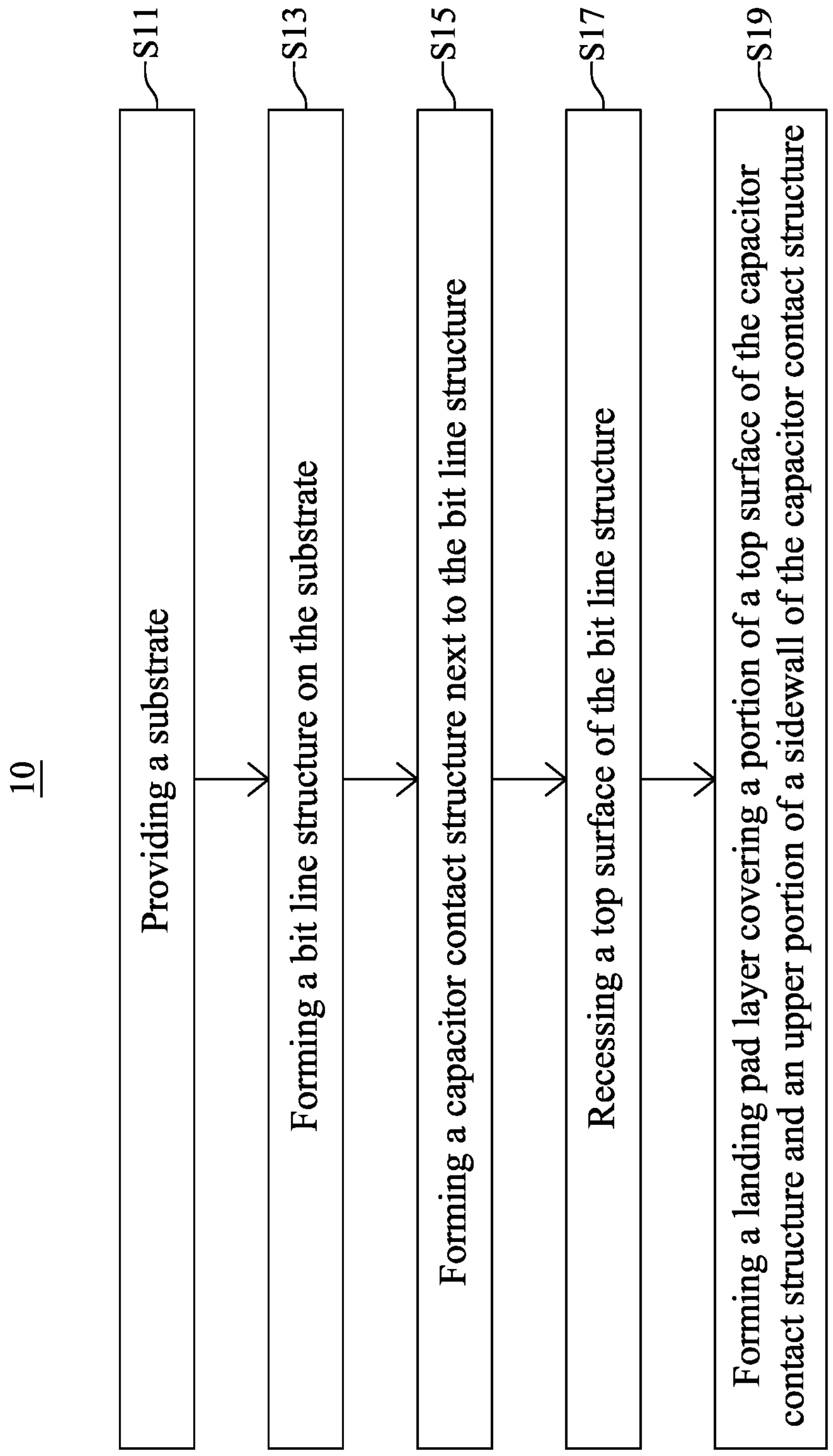
FIG. 31 is a flow diagram illustrating a method of fabricating a semiconductor structure in accordance with alternative embodiments of the present disclosure.

FIG. 31 is a flow diagram illustrating a method 10 for fabricating the semiconductor structure 1A in accordance with alternative embodiments of the present disclosure. The method 10 may comprise processes S11, S13, S15, S17 and S19, and descriptions of the processes and intermediate stages for fabricating the semiconductor 1A are provided with reference to FIG. 30 for further understanding.

Referring to FIGS. 30 and 31, in some embodiments, the process S11 of the method 10 comprises: providing a substrate 101; forming an isolation layer 103 in the substrate 101; and defining a plurality of active areas 105 by the isolation layer 103.

In some embodiments, the process S13 of the method 10 comprises: forming bit line structures 301 on the substrate 101.

In some embodiments, the formation of bit line structure 301 comprises: forming a bit line bottom conductive layer 303 over the substrate 101; forming a bit line middle conductive layer 305 over the bit line bottom conductive layer 303; forming a bit line top conductive layer 307 over the bit line middle conductive layer 305; and forming a bit line capping layer 309 over the bit line top conductive layer 307.

In some embodiments, the process S15 of the method 10 comprises: forming a capacitor contact structure 401 next to the bit line structure 301 and protruding from the substrate 101.

In some embodiments, the formation of the capacitor contact structure 401 comprises: forming a capacitor contact bottom conductive layer 403 protruding from the substrate 101; forming a capacitor contact middle conductive layer 405 on the capacitor contact bottom conductive layer 403; and forming a capacitor contact top conductive layer 407 on the capacitor contact middle conductive layer 405.

In some embodiments, the process S15 of the method 10 further comprises a process S151: forming a dielectric liner 402 along a sidewall 403SW of the capacitor contact bottom conductive layer 403 and along a sidewall 405SW of the capacitor contact middle conductive layer 405, surrounding at least a portion 412 of the capacitor contact bottom conductive layer 403 and a portion 432 of the capacitor contact middle conductive layer 405.

In some embodiments, the process S17 of the method 10 comprises: recessing top surfaces 309TS of the bit line structures 301.

In some embodiments, the process S19 of the method 10 comprises: forming landing pad layers 501 partially covering the capacitor contact structures 401, wherein the landing pad layers 501 cover a portion of a top surface 407TS of the capacitor contact structure 401 and an upper portion of a sidewall 407SW of the capacitor contact structure 401.

Figure 32:
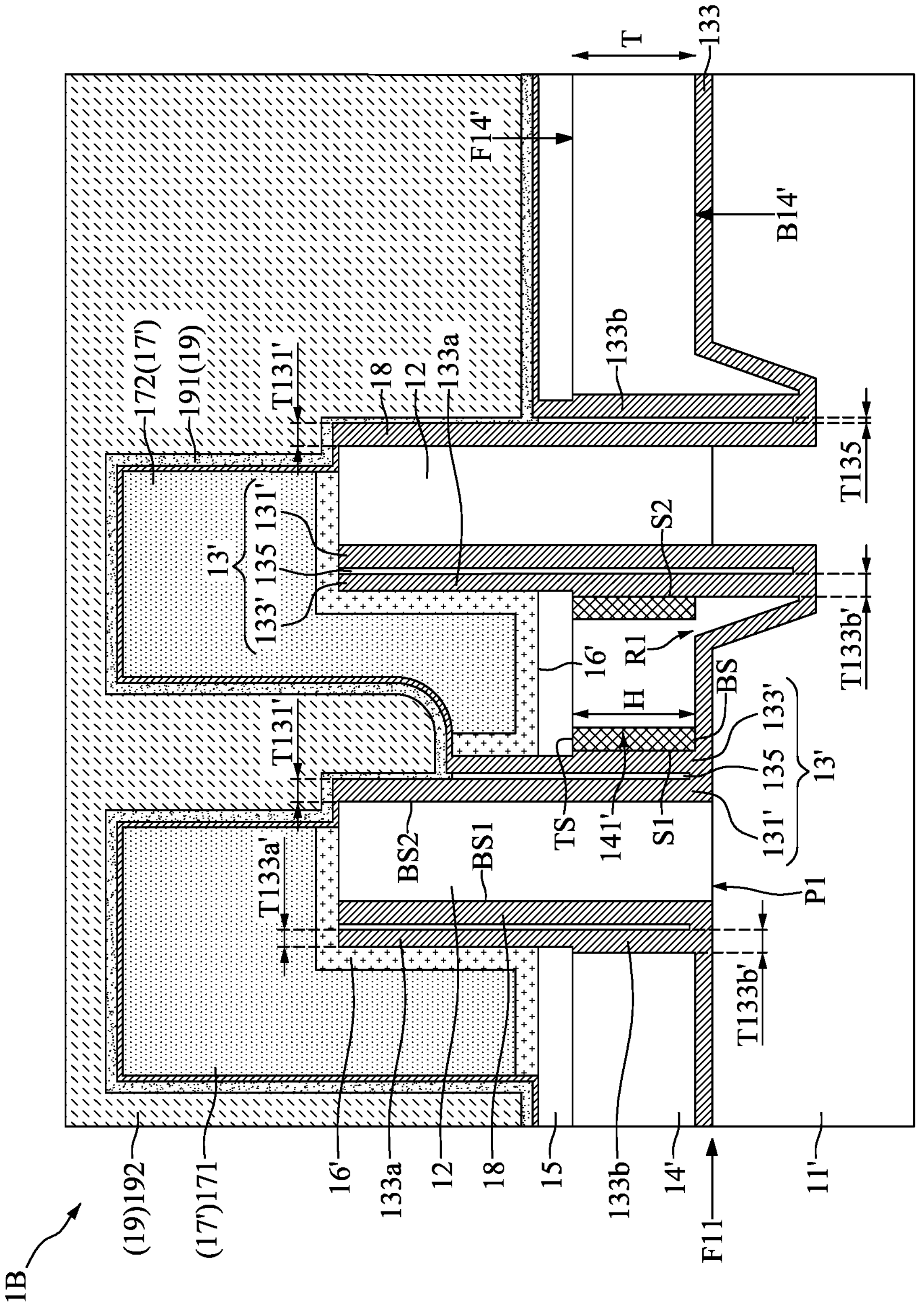
FIG. 32 is a schematic cross-sectional diagram of a semiconductor structure in accordance with alternative embodiments of the present disclosure.

Referring to FIG. 32, FIG. 32 is a schematic cross-sectional diagram of a semiconductor structure 1B in accordance with alternative embodiments of the present disclosure. The semiconductor structure 1B may include a polysilicon layer 14', a substrate 11', a bit line structure 12 and a spacer structure 13'.

The polysilicon layer 14' has a first surface F14' and a second surface B14' opposite to the first surface F14'. In some embodiments, the substrate 11' is disposed on the second surface B14' of the polysilicon layer 14'. In some embodiments, the bit line structure 12 is disposed on the substrate 11', penetrating through the polysilicon layer 14' and protruding from the first surface F14' of the polysilicon layer 14'.

The substrate 11' and the bit line structure 12 are similar to the substrate 11 and the first bit line structure 21 (or the second bit line structure 22) of the semiconductor structure illustrated in FIG. 1 and thus descriptions of the substrate 11' and the bit line structure 12 will not be repeated herein.

The spacer structure 13' is disposed on lateral sidewalls BS1 and BS2 of the bit line structure 12. In some embodiments, the spacer structure 13' may include a first dielectric layer 131' and a second dielectric layer 133', wherein the second dielectric layer 133' includes spacer portions 133*a* and 133*b* of a dielectric layer 133, wherein the spacer portion 133*b* is disposed in the polysilicon layer 14', and the spacer portion 133*a* is disposed outside the polysilicon layer 14'. In some embodiments, the spacer structure 13' includes a gap 135 sandwiched by the first dielectric layer 131' and the second dielectric layer 133'. A thickness T133*a*' of the spacer portion 133*a* of the dielectric layer 133 is less than a thickness T133*b*' of the spacer portion 133*b* of the dielectric layer 133. In some embodiments, a width T135 of the gap 135 is in a range of 3 to 5 nanometers. In some embodiments, the thickness T133*a*' of the spacer portion 133*a* is in a range of 4 to 8.5 nanometers. In some embodiments, the thickness T133*b*' of the spacer portion 133*b* is in a range of 5.5 to 10 nanometers. In some embodiments, the thickness T131' of the first dielectric layer 131' is in a range of 5.5 to 12 nanometers. In some embodiments, the thickness T131' of the first dielectric layer 131' is substantially equal to the thickness T133*b*' of the spacer portion 133*b*. In some embodiments, materials of the first dielectric layer 131' and the second dielectric layer 133' are the same. In some embodiments, the first dielectric layer 131' and the second dielectric layer 133' are made of nitride (e.g., silicon nitride). In some embodiments, the first dielectric layer 131' and the second dielectric layer 133' are made of oxide (e.g., silicon oxide).

In some embodiments, the semiconductor structure 1B further includes a pair of dielectric liners 141' disposed in the polysilicon layer 14' and disposed on lateral sidewalls S1, S2 of the spacer portion 133*b* of the dielectric layer 133, wherein the dielectric liners 141' are spaced apart from each other and face toward each other. In some embodiments, the pair of dielectric liners 141' is disposed between a bit line structure 12 and an adjacent bit line structure 12. In some embodiments, the dielectric liners 141' are disposed to penetrate the polysilicon layer 14'. In some embodiments, a top surface TS of the dielectric liner 141' is substantially coplanar with the first surface F14' of the polysilicon layer 14'. In some embodiments, a bottom surface BS of the dielectric liner 141' is substantially coplanar with the second surface B14' of the polysilicon layer 14'. The dielectric liner 141' may be formed of materials same as those of the dielectric liner 42 of the semiconductor structure illustrated in FIG. 1. A height H of the dielectric liner 141' may be equal to or less than a thickness T of the polysilicon layer 14'.

In some embodiments, the semiconductor structure 1B further includes a metal layer 15 disposed over the polysilicon layer 14', a landing pad 17' disposed over the metal layer 15, and an adhesion layer 16' disposed between the metal layer 15 and the landing pad 17', wherein the adhesion layer 16' lines portions of top surfaces of the metal layer 15, sidewalls of the spacer structure 13', top surfaces of the spacer structure 13', and portions of the bit line structure 12.

In some embodiments, the semiconductor structure 1B further includes a spacer layer 18 lining exposed portions of the metal layer 15, the adhesion layer 16', the landing pad 17', the bit line structure 12, and the spacer structure 13', and the semiconductor structure 1B further includes a seal layer 19 disposed covering the spacer layer 18.

Figure 33:
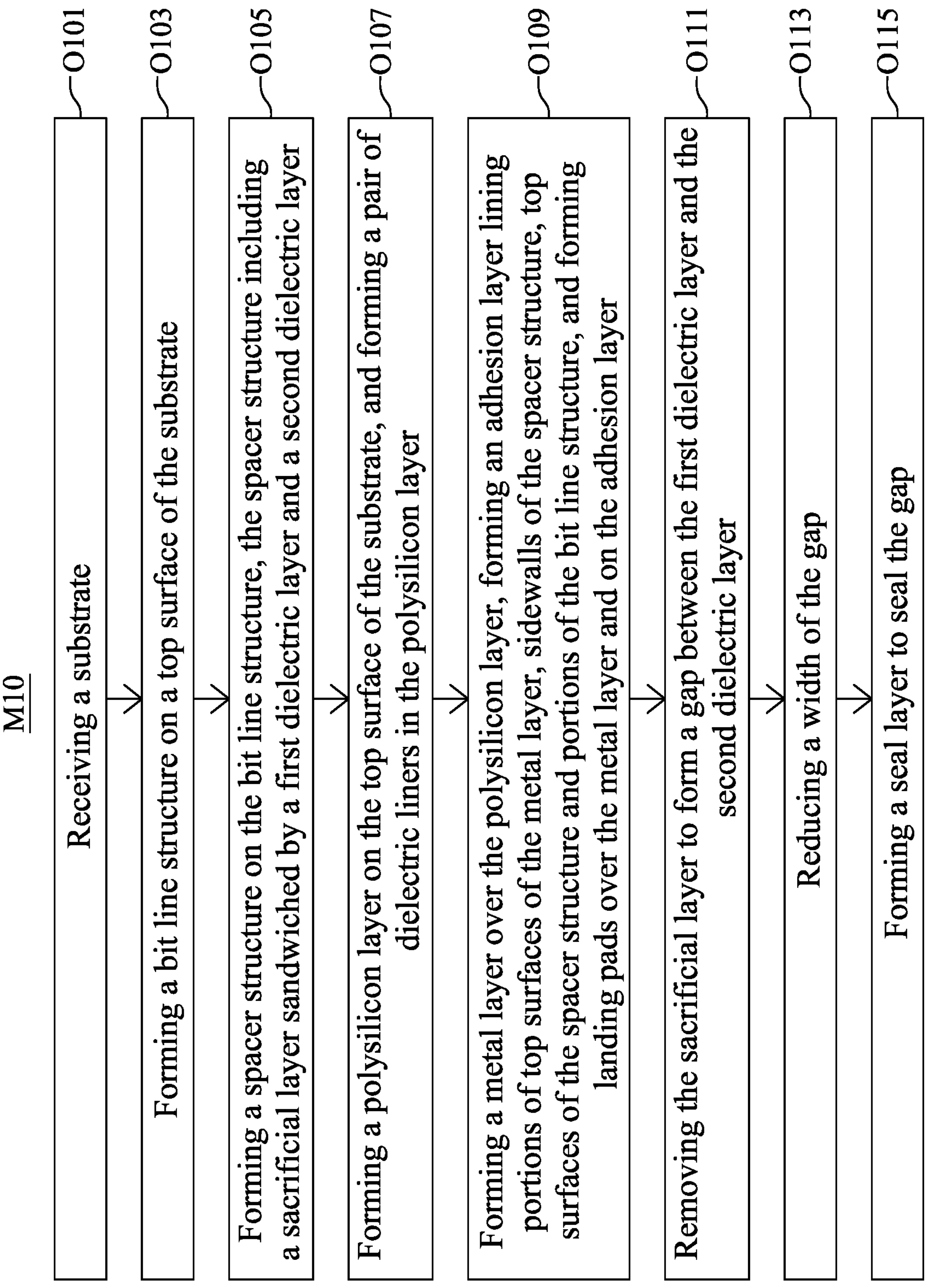
FIG. 33 is a flow diagram illustrating a method of fabricating a semiconductor structure in accordance with alternative embodiments of the present disclosure.

FIG. 33 is a flow diagram illustrating a method M10 for fabricating the semiconductor structure 1B in accordance with alternative embodiments of the present disclosure. The method M10 may comprise processes O101, O103, O105, O107, O109, O111, O113 and O115, and descriptions of the processes and intermediate stages for fabricating the semiconductor are provided with reference to FIG. 32 and FIGS. 34 to 36 for further understanding.

Figure 34:
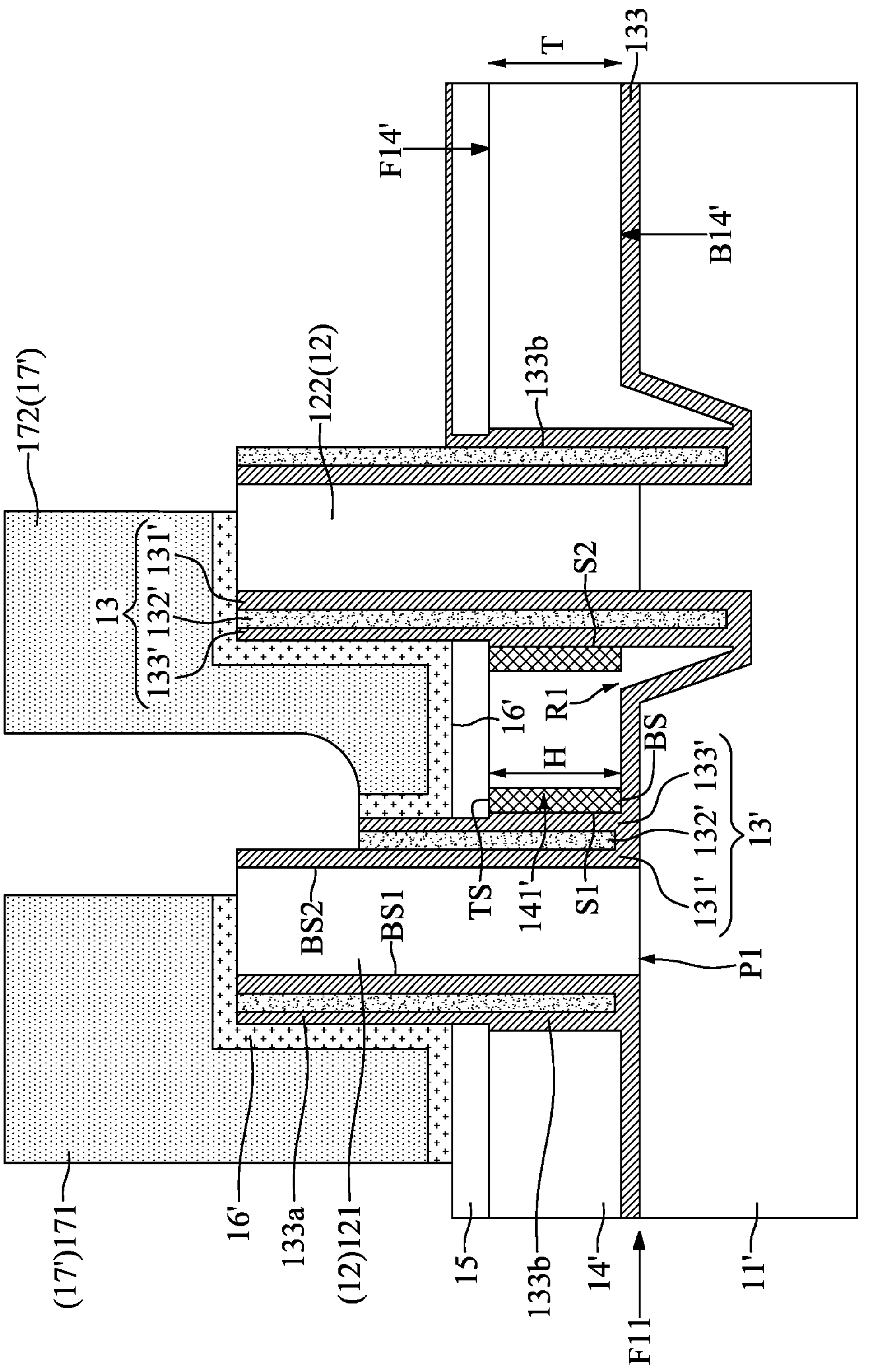
FIGS. 34 to 36 are schematic cross-sectional diagrams illustrating intermediate stages for fabricating the semiconductor in FIG. 32 in accordance with alternative embodiments of the present disclosure.

Referring to FIGS. 33 and 34, in some embodiments, the process O101 of the method M10 comprises receiving a substrate 11', wherein the substrate 11' is the same or similar to the substrate 11 of the semiconductor structure illustrated in FIG. 1

In some embodiments, the process O103 of the method M10 comprises forming bit line structures 12 on a top surface F11 of the substrate 11', wherein recessed portions R1 are formed on the top surface F11 of the substrate 11', adjacent to two lateral sides of one of the bit line structures 12, and an adjacent bit line structure 12 is formed on a planar portion of the top surface F11 of the substrate 11' with no recessed portions R1 nearby.

In some embodiments, the process O105 of the method M10 comprises forming a spacer structure 13' on the bit line structure 12, wherein the spacer structure 13' includes a sacrificial layer 132' sandwiched by a first dielectric layer 131' and a second dielectric layer 133'.

In some embodiments, the process O107 of the method M10 comprises forming a polysilicon layer 14' over the top surface F11 of the substrate 11', wherein the polysilicon layer 14' has a first surface F14' and a second surface B14' opposite to the first surface F14'; and forming a pair of dielectric liners 141' in the polysilicon layer 14' and on lateral sidewalls S1, S2 of spacer portions 133*b* of the second dielectric layer 133', wherein the dielectric liners 141' are spaced apart from each other and face toward each other.

In some embodiments, the process O109 of the method M10 comprises forming a metal layer 15 over the polysilicon layer 14'; forming an adhesion layer 16' lining portions of top surfaces of the metal layer 15, sidewalls of the spacer structure 13', top surfaces of the spacer structure 13' and portions of the bit line structure 12; and forming landing pads 17' over the metal layer 15 and on the adhesion layer 16'.

Figure 35:
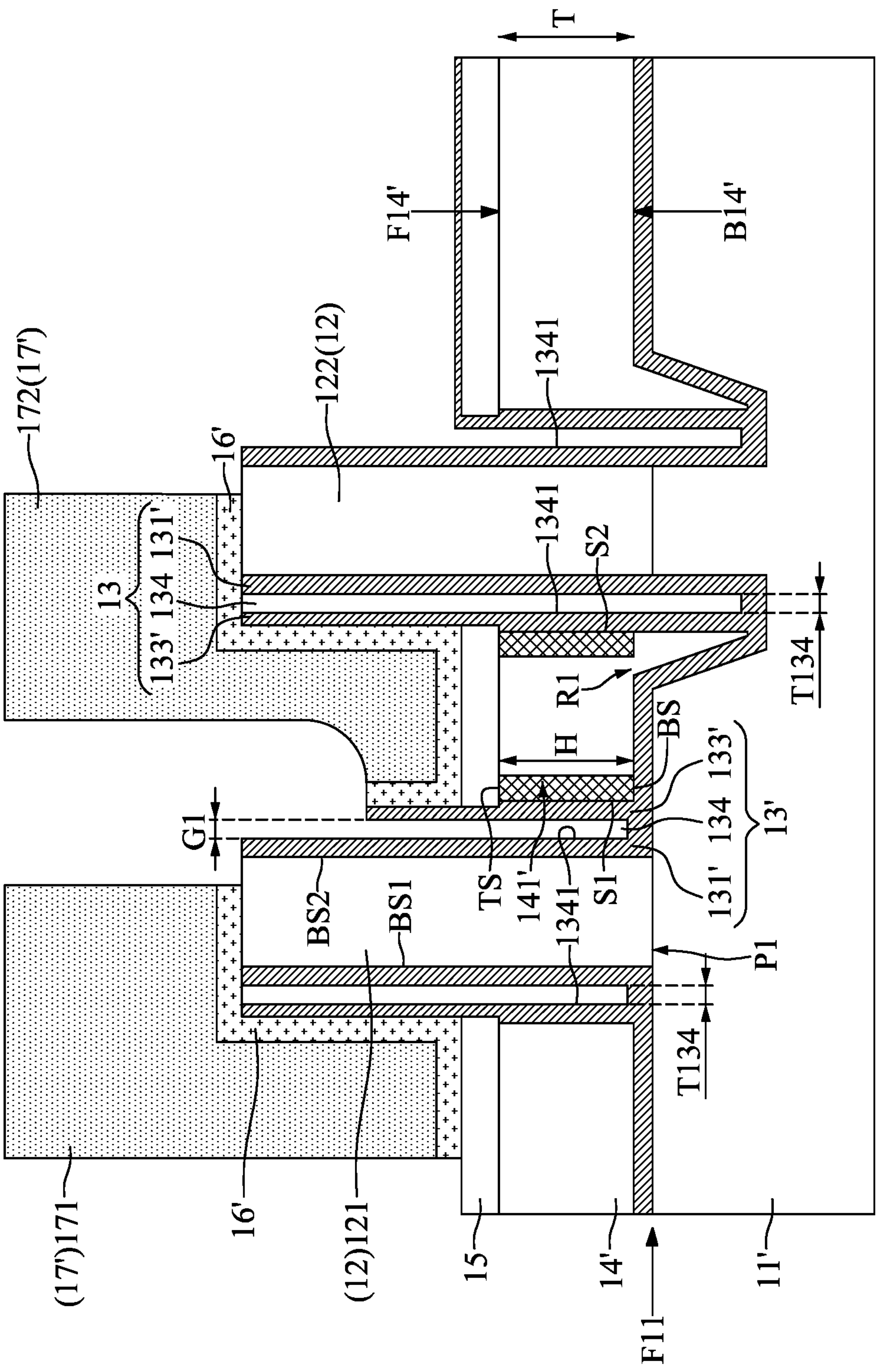
Figure 36:
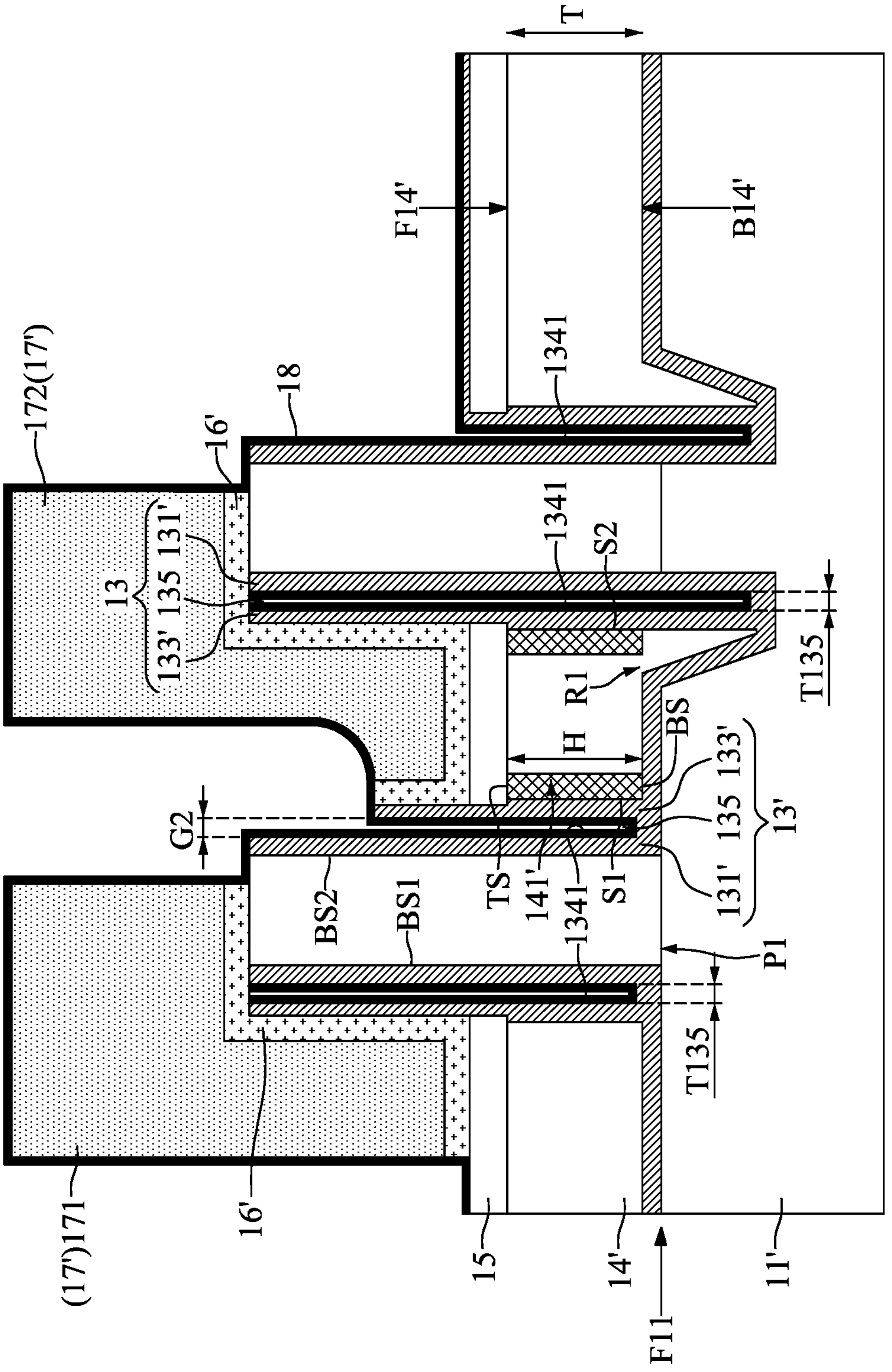

Referring to FIGS. 33 and 35, in some embodiments, the process O111 of the method M10 comprises removing the sacrificial layer 132' to form a gap 134 between the first dielectric layer 131' and the second dielectric layer 133', wherein the gap 134 has a width T134. Referring to FIGS. 33 and 36, in some embodiments, the process O113 of the method M10 comprises reducing the width T134 of the gap 134 by depositing a spacer layer 18 lining the intermediate structure shown in FIG. 35. Thus, as shown in FIG. 36, a width T135 of the gap 135 is reduced. That is, the width T135 of the gap 135 is less than the width T134 of the gap 134. It should be noted that, in some embodiments, the spacer layer 18 is made of the same material as the first dielectric layer 131' and/or the second dielectric layer 133'. In some embodiments, there is no distinct interface between the spacer layer 18 and the first dielectric layer 131' if the spacer layer 18 and the first dielectric layer 131' are made of the same material. In some embodiments, the spacer layer 18 may be formed by atomic layer deposition.

Referring to FIGS. 33 and 32, in some embodiments, the process O115 of the method M10 comprises forming a seal layer 19 to seal the gap. In some embodiments, the seal layer 19 is a multi-layered structure. In some embodiments, the seal layer 19 includes a linear layer 191 and a planar layer 192.

Therefore, the present disclosure provides a novel structure of a bit line structure and a method for manufacturing the same. The bit line structure of the present disclosure has a dielectric liner disposed along a sidewall of a polysilicon layer. The dielectric liner may prevent charges (e.g., charges stored in a capacitor configured on a landing pad) from leaking into the polysilicon layer. In addition, a neck portion of the landing pad may not need to be narrowed due to the deposition of the dielectric liner since a top surface of the dielectric liner is lower than the neck portion of the landing pad.

One aspect of the present disclosure provides a semiconductor structure. The semiconductor structure includes a substrate; a bit line structure disposed over the substrate; a plurality of capacitor contact structures disposed next to the bit line structure; a plurality of dielectric liners disposed in the capacitor contact structures, wherein each of the dielectric liners surrounds at least a portion of the corresponding capacitor contact structures; and a plurality of landing pad layers each disposed partially covering a top surface and a sidewall of the corresponding capacitor contact structure. The substrate includes an isolation layer, wherein the isolation layer defines a plurality of active areas, and a plurality of source regions and drain regions are disposed in the active areas.

Another aspect of the present disclosure provides a method for fabricating a semiconductor structure. The method includes providing a substrate; forming a bit line structure on the substrate; forming a capacitor contact structure next to the bit line structure, wherein the capacitor contact structure protrudes from the substrate; recessing a top surface of the bit line structure; and forming a landing pad layer partially covering a top surface of the capacitor contact structure and partially covering a sidewall of the capacitor contact structure.

Another aspect of the present disclosure provides a semiconductor structure. The semiconductor structure includes a polysilicon layer having a first surface and a second surface opposite to the first surface; a substrate disposed on the second surface of the polysilicon layer; a plurality of bit line structures disposed on the substrate; and a spacer structure disposed on lateral sidewalls of the bit line structure, wherein in a cross-sectional view perspective, the polysilicon layer includes a pair of dielectric liners disposed in the polysilicon layer and disposed on lateral sidewalls of the spacer structure, and the dielectric liners are spaced apart from each other and face toward each other.

Another aspect of the present disclosure provides a method for fabricating a semiconductor structure. The method includes receiving a substrate; forming a bit line structure on a top surface of the substrate; forming a spacer structure on the bit line structure, wherein the spacer structure includes a sacrificial layer sandwiched by a first dielectric layer and a second dielectric layer; forming a polysilicon layer over the top surface of the substrate, and forming a pair of dielectric liners in the polysilicon layer, wherein the polysilicon layer has a first surface and a second surface opposite to the first surface; removing the sacrificial layer to form a gap between the first dielectric layer and the second dielectric layer; reducing a width of the gap; and forming a seal layer to seal the gap.

In conclusion, the application discloses a manufacturing method of a semiconductor structure and a semiconductor structure thereof. The presence of a dielectric liner in the semiconductor structure prevents charge leakage from a bit line structure to a polysilicon layer, and correctness of data stored in the bit line structure can be protected.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims in are intended to include within their scope such processes, machines, manufacture, compositions of matter, means, methods and steps.

What is claimed is:

1. A semiconductor structure, comprising:

a substrate having an isolation layer;

a plurality of active areas defined by the isolation layer;

a plurality of source regions and drain regions disposed in the active areas;

a bit line structure disposed over the substrate;

a plurality of capacitor contact structures disposed next to the bit line structure;

a plurality of dielectric liners disposed in the capacitor contact structures, wherein each of the dielectric liners surrounds at least a portion of the corresponding capacitor contact structures; and a plurality of landing pad layers disposed partially covering a top surface and a sidewall of the corresponding capacitor contact structure.

2. The semiconductor structure of claim 1, wherein the bit line structure comprises a bit line bottom conductive layer disposed over the substrate, a bit line middle conductive layer disposed over the bit line bottom conductive layer, and a bit line top conductive layer disposed over the bit line middle conductive layer.

3. The semiconductor structure of claim 2, wherein the bit line bottom conductive layer is formed of polycrystalline silicon, polycrystalline germanium, polycrystalline silicon germanium, titanium, tantalum, tungsten, copper, aluminum, tungsten silicide, cobalt silicide, or titanium silicide.

4. The semiconductor structure of claim 3, wherein the bit line middle conductive layer is formed of titanium nitride or tantalum nitride.

5. The semiconductor structure of claim 4, wherein the bit line top conductive layer is formed of tungsten, tantalum, titanium, copper, or aluminum.

6. The semiconductor structure of claim 1, further comprising a bit line contact disposed in the substrate.

7. The semiconductor structure of claim 6, wherein the bit line structure is disposed on the bit line contact.

8. The semiconductor structure of claim 1, further comprising a plurality of bit line capping layers disposed over the substrate, wherein each of the bit line capping layers is disposed on the corresponding bit line structure.

9. The semiconductor structure of claim 1, wherein the capacitor contact structure comprises a capacitor contact bottom conductive layer disposed in the substrate and protruding from the substrate, a capacitor contact middle conductive layer disposed on the capacitor contact bottom conductive layer, and a capacitor contact top conductive layer disposed on the capacitor contact middle conductive layer.

10. The semiconductor structure of claim 8, further comprising a plurality of bit line spacers disposed in and protruding from the substrate, wherein the bit line spacer is between the bit line structure and the capacitor contact structure, wherein a bottom surface of the bit line spacer is coplanar with a bottom surface of the bit line contact.

11. The semiconductor structure of claim 8, further comprising a plurality of bit line spacers disposed on the substrate, wherein the bit line spacer is between the bit line structure and the capacitor contact structure, wherein a top surface of the bit line spacer is coplanar with a top surface of the bit line contact.

* * * * *